United States Patent
Inano et al.

(10) Patent No.: US 10,015,912 B2
(45) Date of Patent: Jul. 3, 2018

(54) DATA CENTER WITH LIQUID IMMERSION TANK AND CONTROL METHOD OF THE DATA CENTER BASED ON TEMPERATURE DIFFERENCE

(71) Applicant: FUJITSU LIMITED, Kawasaki-shi, Kanagawa (JP)

(72) Inventors: Satoshi Inano, Minoh (JP); Hiroyuki Fukuda, Yokohama (JP); Hiroyoshi Kodama, Isehara (JP); Hiroshi Endo, Atsugi (JP); Yukiko Wakino, Sagamihara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/433,445

(22) Filed: Feb. 15, 2017

(65) Prior Publication Data

US 2017/0303443 A1    Oct. 19, 2017

(30) Foreign Application Priority Data

Apr. 13, 2016    (JP) .................................. 2016-080193

(51) Int. Cl.
*H05K 7/20* (2006.01)
*G06F 1/20* (2006.01)

(52) U.S. Cl.
CPC ......... *H05K 7/20836* (2013.01); *G06F 1/206* (2013.01); *H05K 7/2079* (2013.01); *H05K 7/20236* (2013.01)

(58) Field of Classification Search
None
See application file for complete search history.

(56) References Cited

U.S. PATENT DOCUMENTS

| | | | | |
|---|---|---|---|---|
| 2011/0132579 A1* | 6/2011 | Best | .................. | H05K 7/20763 165/104.31 |
| 2011/0271695 A1* | 11/2011 | Kashirajima | .......... | G06F 1/206 62/62 |
| 2013/0264046 A1* | 10/2013 | Chainer | .................. | G06F 1/206 165/287 |
| 2014/0218858 A1* | 8/2014 | Shelnutt | ................. | G06F 1/206 361/679.31 |
| 2015/0138723 A1* | 5/2015 | Shedd | ............... | H05K 7/20809 361/679.47 |

(Continued)

FOREIGN PATENT DOCUMENTS

JP    08-097338    4/1996

OTHER PUBLICATIONS

'Cooling Tower', https://en.wikipedia.org/w/index.php?title=Cooling_tower&oldid=811877367 (2017).*

(Continued)

*Primary Examiner* — Mohammad Ali
*Assistant Examiner* — Bernard G Lindsay
(74) *Attorney, Agent, or Firm* — Fujitsu Patent Center

(57) ABSTRACT

A data center includes: a liquid immersion tank that holds an information processing apparatus in a cooling liquid; a cooling apparatus that cools a pipe exposed to outside air and through which the cooling liquid flows from the liquid immersion tank; and a pump apparatus that delivers the cooling liquid from the cooling apparatus to the liquid immersion tank.

14 Claims, 17 Drawing Sheets

(56) References Cited

U.S. PATENT DOCUMENTS

2015/0181762 A1* 6/2015 Boyd ................ H05K 7/20272
165/104.33
2015/0354851 A1* 12/2015 Yoshii ................ H05K 7/2079
62/179

OTHER PUBLICATIONS

Endo et al., "TSUBAME-KFC: Ultra Green Super Computer Research Facility Using Liquid Immersion Cooling" [online], International Academic Information Center of Tokyo Institute of Technology, [Searched on Apr. 8, 2016], Internet <URL: http://www.el.gsic.titech.ac.jp/~endo/publication/endo-hokke13-slides.pdf>, Partial English Translation (37 pages).

* cited by examiner

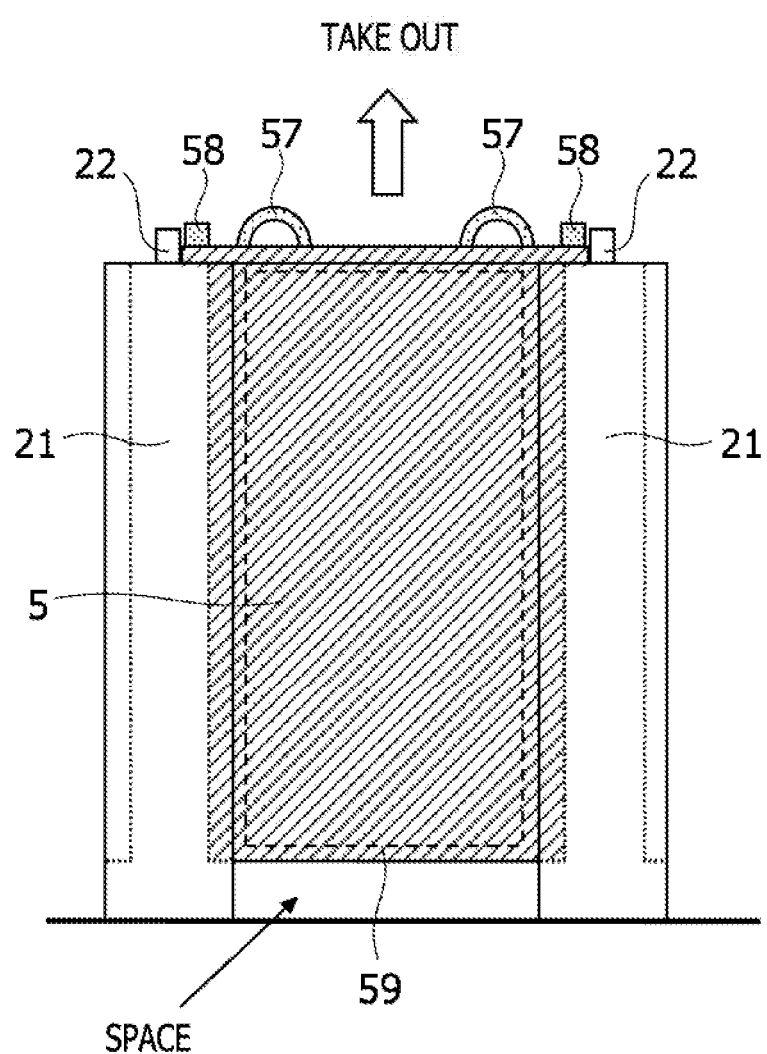

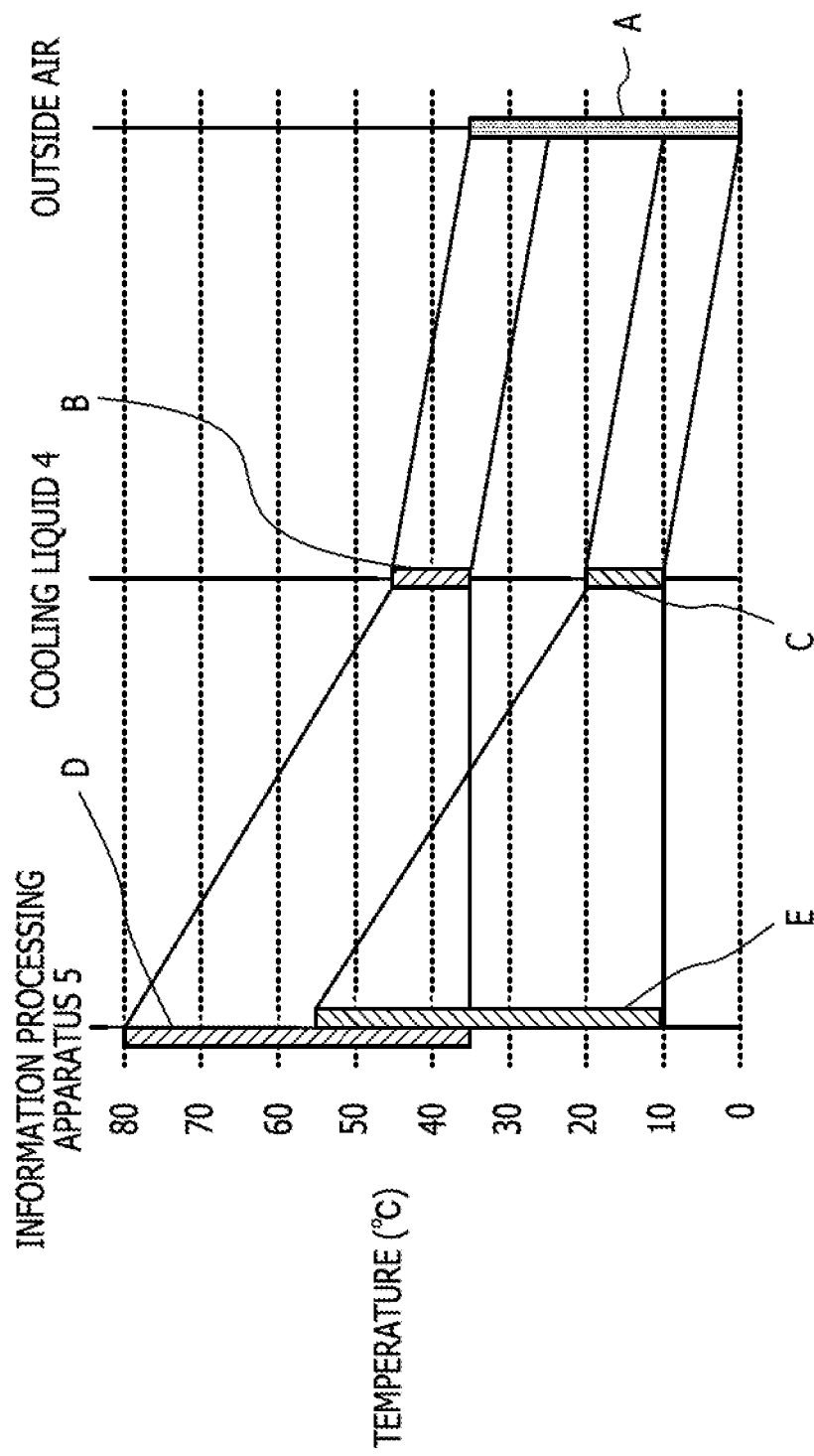

FIG. 12

| POWER ITEM (kw) | EMBODIMENT 1,2 | COMPARATIVE EXAMPLE 1 |
|---|---|---|
| TOTAL POWER OF INFORMATION PROCESSING APPARATUS | 15 | 15 |
| TOTAL POWER OF LIQUID IMMERSION COOLING SYSTEM | 2.25 | 5.8 |
| PUMP APPARATUS | 1.5 | 2.2 |
| COOLING TOWER | – | 3.6 |
| CHILLER | 0.75 | – |
| ENTIRE POWER | 17.25 | 20.8 |
| PUE | 1.150 | 1.387 |

DATA CENTER WITH LIQUID IMMERSION TANK AND CONTROL METHOD OF THE DATA CENTER BASED ON TEMPERATURE DIFFERENCE

CROSS-REFERENCE TO RELATED APPLICATION

This application is based upon and claims the benefit of priority of the prior Japanese Patent Application No. 2016-080193, filed on Apr. 13, 2016, the entire contents of which are incorporated herein by reference.

FIELD

The embodiments discussed herein are related to a data center and a control method of the data center.

BACKGROUND

In a data center, reduction of the total costs from introduction to operation of information and communication technology (ICT) equipment, such as, for example, a server, may be required. As detailed cost reduction, a technique of (1) or (2) given below is considered:

(1) Reduction of the installation cost of the cooling equipment by the high integration of information processing apparatuses (ICT equipment) such as, for example, a server, and the reduction and optimization of the cooling equipment; and (2) Reduction of the operation cost and cooling cost of the cooling equipment by the highly efficient heat exhaust of the information processing apparatus.

In order to implement the technique of (1) or (2) described above, liquid immersion cooling has attracted public attentions as a cooling method and a mounting method of the information processing apparatus.

Related technologies are disclosed in, for example, Japanese Laid-Open Patent Publication No. 08-097338.

Related technologies are disclosed in, for example, *"TSU-BAME-KFC: Ultra Green Super Computer Research Facility Using Liquid Immersion Cooling"* by Toshio Endo and two others, [online], International Academic Information Center of Tokyo Institute of Technology, [Searched on Apr. 8, 2016], Internet <URL: http://www.el.gsic.titech.ac.jp/~endo/publication/endo-hokke13-slides.pdf> (Non-Patent Document 1).

SUMMARY

According to one aspect of the embodiments, a data center includes: a liquid immersion tank that holds an information processing apparatus in a cooling liquid; a cooling apparatus that cools a pipe exposed to outside air and through which the cooling liquid flows from the liquid immersion tank; and a pump apparatus that delivers the cooling liquid from the cooling apparatus to the liquid immersion tank.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

FIG. 3C is a side view in the inside of the liquid immersion tank;

FIG. 4 is a view illustrating an exemplary temperature diagram of the data center according to the first embodiment;

FIG. 12 is a view illustrating power of the data center according to the first and second embodiments and power of a liquid immersion cooling system according to Comparative Example 1;

DESCRIPTION OF EMBODIMENTS

For example, a semiconductor stack is accommodated in a tank filled with insulation oil, the heat of the semiconductor stack is dissipated to the insulation oil, causes the insulation oil to be naturally convected in the tank or forcibly convected by a pump, and the insulation oil is cooled by heat exchange with atmospheric air through a radiator installed in the tank. For example, a liquid immersion cooling technology and an outside air cooling technology using an oil immersion rack, a heat exchanger, and a cooling tower is provided.

In liquid immersion cooling, an information processing apparatus is immersed in a cooling liquid or a coolant of a liquid immersion tank. In the liquid immersion cooling, a heat exchanger that cools the cooling liquid in the liquid immersion tank and a chiller or a cooling tower that cools the cooling water of the heat exchanger are used. Since the heat exchanger that cools the cooling liquid in the liquid immersion cooling is used in this liquid immersion cooling, the initial cost or operation cost at the time of introduction may be large. A technology that reduces the cost without performing a heat exchange between a cooling liquid and cooling water may be provided.

Hereinafter, a data center and a control method of the data center according to embodiments will be described with reference to the accompanying drawings. Configurations of the data center and the data center control method disclosed hereinbelow are examples and are not limited to the configurations of the data center and the data center control method according to embodiments of the present disclosure.

Figure 13:
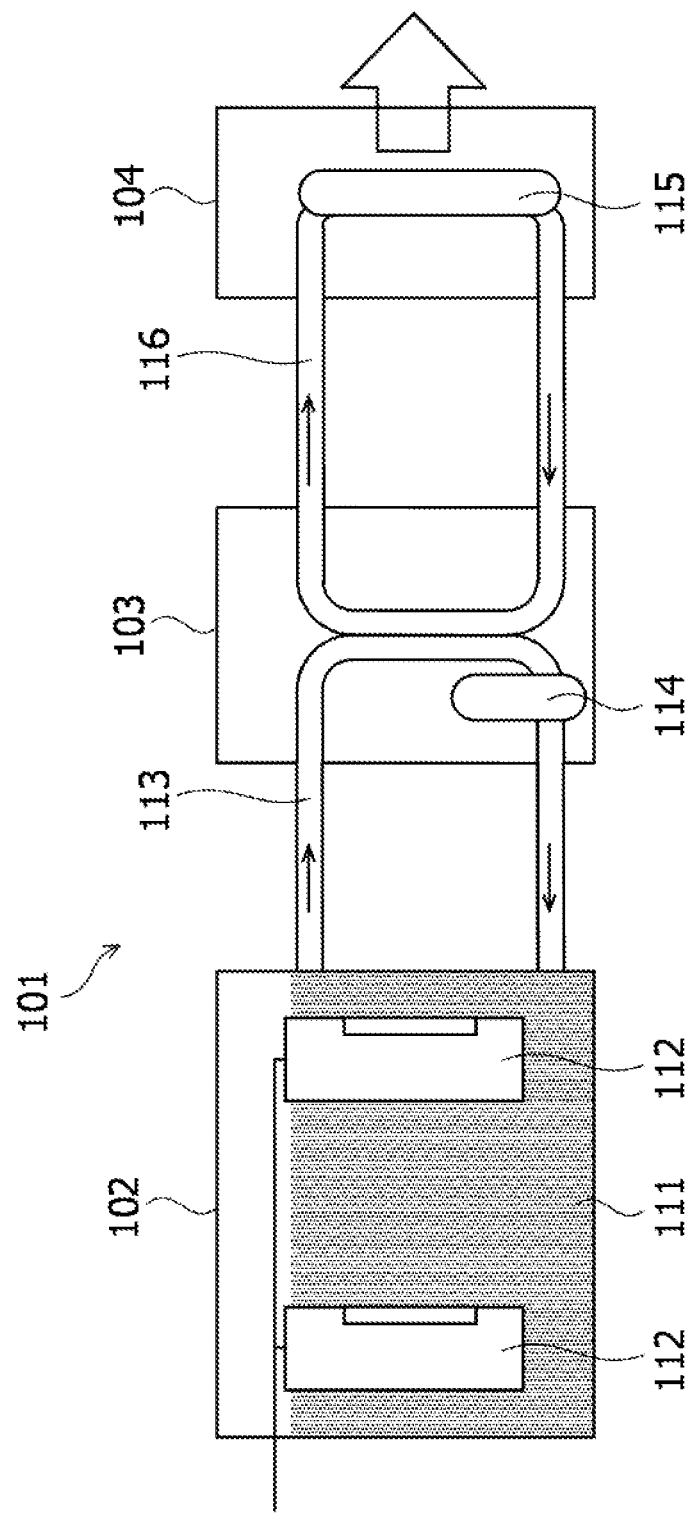
FIG. 13 is a view illustrating a configuration of the liquid immersion cooling system according to Comparative Example 1.

Comparative Examples 1 and 2 will be described with reference to FIGS. 13 to 16. FIG. 13 is a view illustrating a configuration of a liquid immersion cooling system 101 according to Comparative Example 1. As illustrated in FIG. 13, a liquid immersion tank 102 and a heat exchanger 103 are coupled to each other, and the heat exchanger 103 and a chiller 104 are coupled to each other. A cooling liquid 111 is accommodated in the liquid immersion tank 102 and one or more information processing apparatuses 112 are held in the cooling liquid 111. The information processing apparatus 112 is ICT equipment such as, for example, a personal computer or a server. The information processing apparatus 112 includes electronic components including a board, a central processing unit such as, for example, a processor mounted on the board, a memory, and an interface. The information processing apparatus 112 and the electronic components are cooled by the cooling liquid 111 in the liquid immersion tank 102.

A pipe 113 coupled to the liquid immersion tank 102 passes through the inside of the heat exchanger 103. The cooling liquid 111 is circulated in the liquid immersion tank 102 and the heat exchanger 103 by the pipe 113 and the pump 114. When the pump 114 is driven, the cooling liquid 111 in the liquid immersion tank 102 flows along the pipe 113 to be supplied to the liquid immersion tank 102.

The chiller 104 has a compressor 115. The chiller 104 cools cooling water by the compressor 115 and then supplies the cooling water to the heat exchanger 103. The chiller 104 recovers the cooling water from the heat exchanger 103. The pipe 116 in which the cooling water flows passes through the inside of the heat exchanger 103 and the inside of the chiller 104. The cooling water is circulated in the heat exchanger 103 and the chiller 104 through the pipe 116. Heat of the cooling water recovered from the heat exchanger 103 is discharged to the outside air. In the heat exchanger 103, a heat exchange is performed between the cooling liquid 111 and the cooling water and the cooling liquid 111 recovered from the liquid immersion tank 102 is cooled by the cooling water supplied from the chiller 104.

The temperature of the cooling liquid 111 supplied from the heat exchanger 103 to the liquid immersion tank 102 is about 15° C. or higher and about 20° C. or lower. A leakage current of the electronic device such as, for example, the processor of the information processing apparatus 112, increases by an increase in ambient temperature, thereby increasing the power consumption of the information processing apparatus 112. Further, the life-span of the information processing apparatus 112 decreases by an increase in temperature when the information processing apparatus 112 operates. The information processing apparatus 112 is actively cooled in consideration of the increase in the power consumption of the information processing apparatus 112 or the influence of the life-span of the information processing apparatus 112. As the cooling liquid 111 in the liquid immersion tank 102, a fluorine-based inert liquid such as, for example, Fluorinert (Trademark), is used by taking priority on the cooling performance or maintenance performance. Further, substitute prone (R407C) may be used instead of the cooling water which is circulated in the heat exchanger 103 and the chiller 104.

Figure 14:
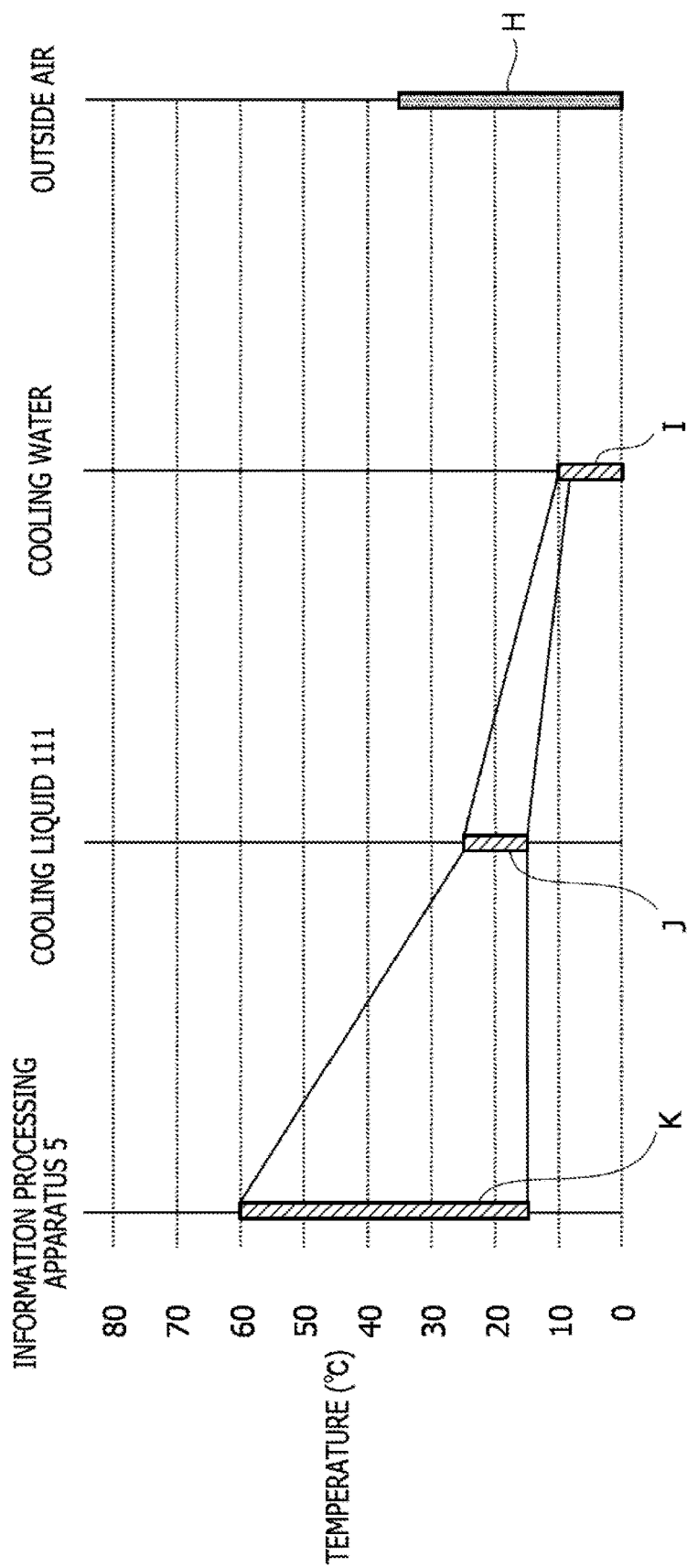
FIG. 14 is a view illustrating a temperature diagram of the liquid immersion cooling system according to Comparative Example 1.

FIG. 14 is a view illustrating a temperature diagram of the liquid immersion cooling system 101 according to Comparative Example 1. A temperature range of the outside air is indicated at the rightmost portion of FIG. 14, the temperature range of the cooling water is indicated at the second portion from the right side of FIG. 14, the temperature range of the cooling liquid 111 is indicated at the second portion from the left side of FIG. 14, and the temperature range of the information processing apparatus 112 is indicated at the leftmost portion of FIG. 14. The temperature range of the information processing apparatus 112 is, for example, a temperature range of the CPU included in the information processing apparatus 112. The temperature range H of the outside air is a yearly range of a wet-bulb temperature of the outside air. In the example illustrated in FIG. 14, the temperature range H of the outside air is about 0° C. to 35° C. The temperature range I of the cooling water is a temperature range which may be taken by the cooling water. In the example illustrated in FIG. 14, the temperature range I of the cooling water is about 0° C. to 10° C. The temperature range J of the cooling liquid 111 is a temperature range that may be taken by the cooling liquid 111. In the example illustrated in FIG. 14, the temperature range J of the cooling liquid 111 is about 15° C. to 25° C. The temperature range K of the information processing apparatus 112 is a temperature range that may be taken by the information processing apparatus 112. In the example illustrated in FIG. 14, the temperature range K of the information processing apparatus 112 is about 15° C. to 60° C.

In the liquid immersion cooling system 101 according to Comparative Example 1, the heat exchanger 103 is used to perform the heat exchange between the cooling liquid 111 and the cooling water by using the high-cost Fluorinert as the cooling liquid 111 due to the cooling performance and the maintenance performance. Therefore, the initial cost of the liquid immersion cooling system 101 according to Comparative Example 1 increases at the time of introducing a facility. Further, the high-cost fluorinert is supplemented or replaced, and as a result, the operation cost of the liquid immersion cooling system 101 according to Comparative Example 1 increases. As illustrated in FIG. 14, since the temperature range J of the cooling liquid 111 is about 15° C. to 25° C., the temperature range K of the information processing apparatus 112 is about 15° C. to 60° C., and as a result, the information processing apparatus 112 is in a supercooled state. In order to maintain the temperature range J of the cooling liquid 111 of about 15° C. to 25° C., the temperature range I of the cooling water is cooled up to about 0° C. to 10° C. by the chiller 104. Therefore, the chiller 104 is excessively operated, and as a result, a needless power cost of the chiller 104 is generated.

Figure 15:
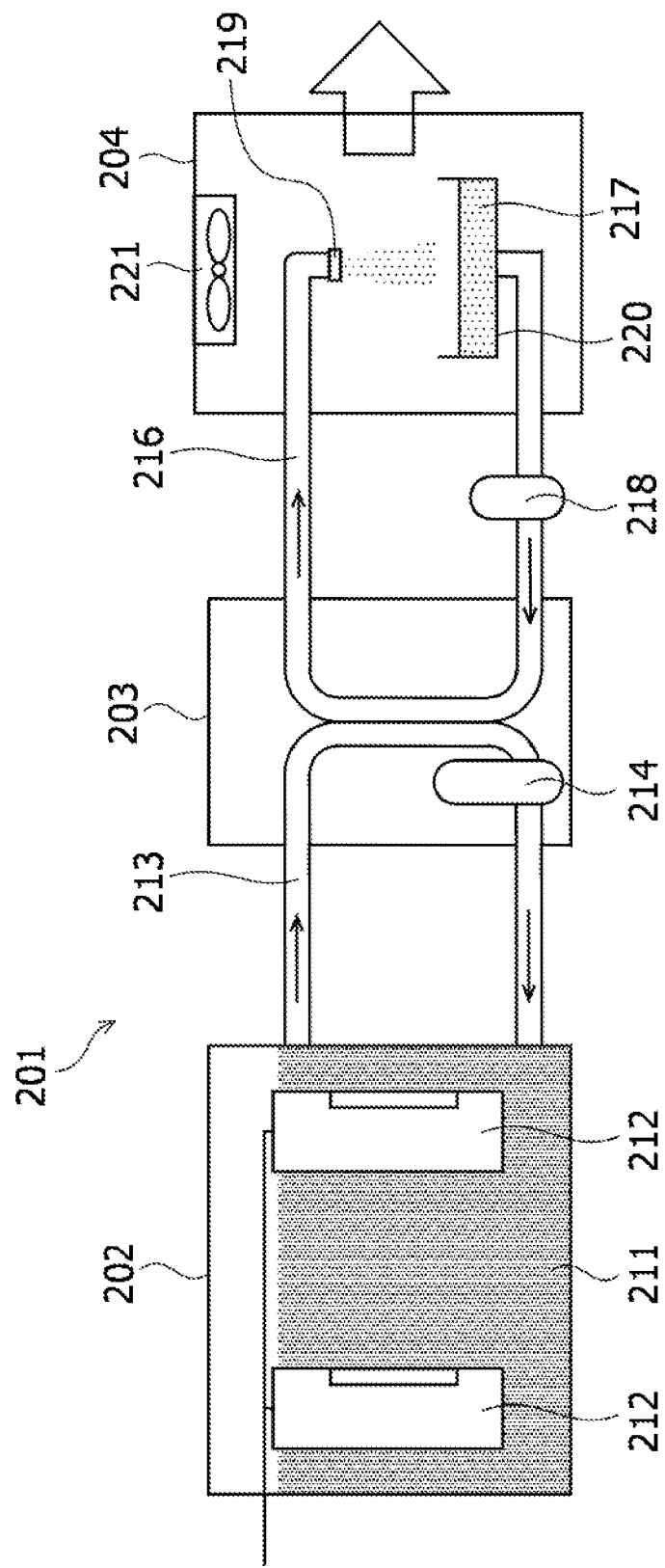
FIG. 15 is a view illustrating a configuration of a liquid immersion cooling system according to Comparative Example 2.

FIG. 15 is a view illustrating a configuration of a liquid immersion cooling system 201 according to Comparative Example 2. As illustrated in FIG. 15, a liquid immersion tank 202 and a heat exchanger 203 are coupled to each other and the heat exchanger 203 and a cooling tower 204 are coupled to each other. A cooling liquid 211 is accommodated in the liquid immersion tank 202 and one or more information processing apparatuses 212 are held in the cooling liquid 211. The information processing apparatus 212 is ICT equipment such as, for example, a personal computer or a server. The information processing apparatus 212 includes electronic components including a board, a central processing unit (CPU) such as, for example, a processor mounted on the board, a memory, and an interface. The information processing apparatus 212 and the electronic components are cooled by the cooling liquid 211 in the liquid immersion tank 202. The cooling liquid 211 is an oil such as, for example, PAO (poly-α-olefin based synthetic oil).

A pipe 213 connected to the liquid immersion tank 202 passes through the inside of the heat exchanger 203. The cooling liquid 211 is circulated in the liquid immersion tank 202 and the heat exchanger 203 by the pipe 213 and the pump 214. When the pump 214 is driven, the cooling liquid 211 in the liquid immersion tank 202 flows along the pipe 213 to be supplied to the liquid immersion tank 202.

The pipe 216 in which the cooling water flows passes through the inside of the heat exchanger 203 and the inside of the cooling tower 204. The cooling tower 204 is a cooling apparatus of an open type water sprinkling and blow cooling type. The cooling tower 204 cools cooling water 217 and then supplies the cooling water 217 to the heat exchanger 203 to recover the cooling water 217 from the heat exchanger 203. A pump 218 is driven to sprinkle the cooling water 217 from a water sprinkling nozzle 219. The cooling water 217 is sprinkled to cool the cooling water 217 using the vaporization heat of the cooling water 217. The sprinkled cooling water 217 is stored in a tank 220. The outside air is received in the cooling tower 204 by driving a blow fan 221, and as a result, the heat of the cooling water 217 is exhausted. In the heat exchanger 203, the heat exchange is performed between the cooling liquid 211 and the cooling water 217, and as a result, the cooling liquid 211 recovered from the liquid immersion tank 202 is cooled by the cooling water 217 supplied from the cooling tower 204.

Figure 16:
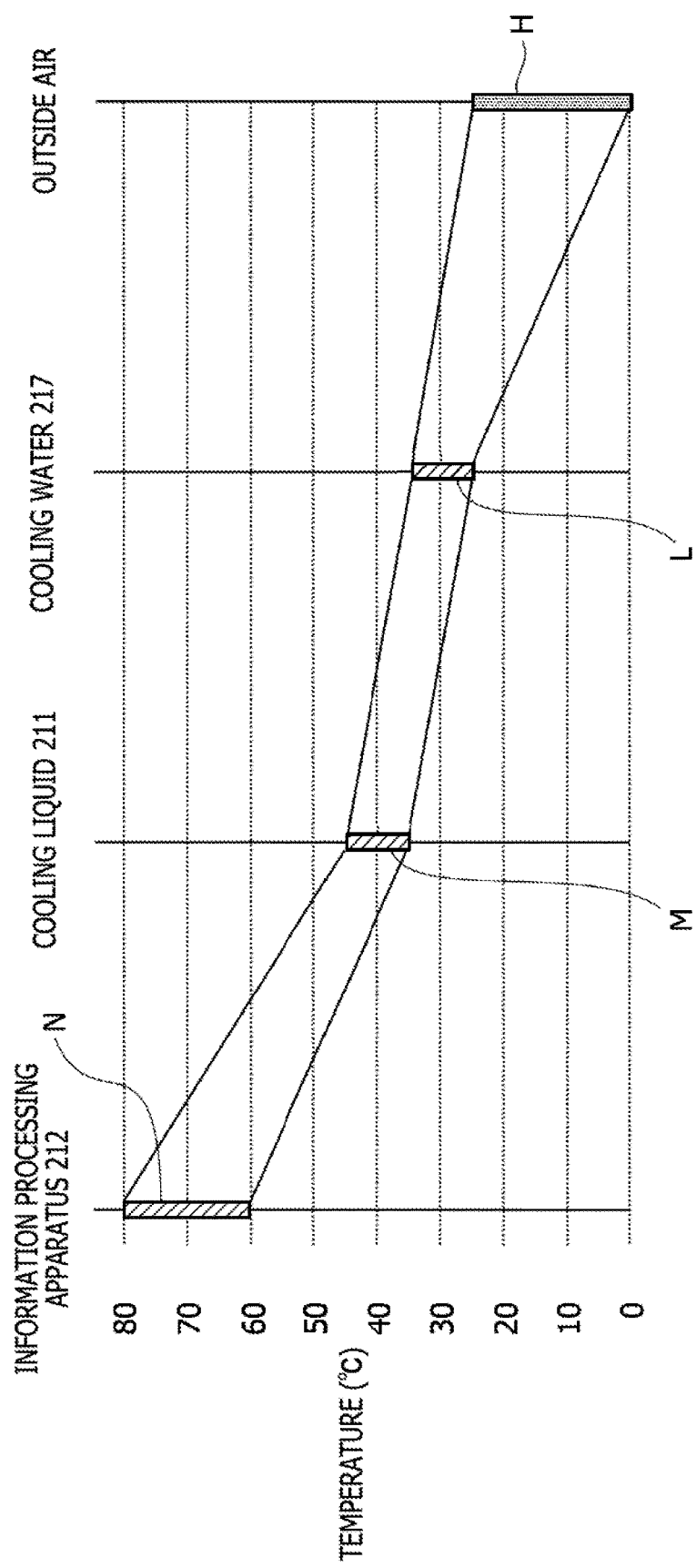
FIG. 16 is a view illustrating a temperature diagram of the liquid immersion cooling system according to Comparative Example 2.

FIG. 16 is a view illustrating a temperature diagram of the liquid immersion cooling system 201 according to Comparative Example 2. The temperature range of the outside air is indicated at the rightmost portion of FIG. 16, the temperature range of the cooling water is indicated at the second portion at the right side of FIG. 16, the temperature range of the cooling liquid 211 is indicated at the second portion from the left side of FIG. 16, and the temperature range of the information processing apparatus 212 is indicated at the leftmost portion of FIG. 16. The temperature range of the information processing apparatus 212 is, for example, the temperature range of the CPU included in the information processing apparatus 212. The temperature range H of the outside air is the yearly range of a wet-bulb temperature of the outside air. In an example illustrated in FIG. 16, the temperature range H of the outside air is about 0° C. to 35° C. The temperature range L of the cooling water 217 is the temperature range which may be taken by the cooling water 217. In the example illustrated in FIG. 16, the temperature range L of the cooling water 217 is about 25° C. to 35° C. The temperature range M of the cooling liquid 211 is the temperature range which may be taken by the cooling liquid 211. In the example illustrated in FIG. 16, the temperature range M of the cooling liquid 211 is about 35° C. to 45° C. The temperature range N of the information processing apparatus 212 is the temperature range which may be taken by the information processing apparatus 212. In the example illustrated in FIG. 16, the temperature range N of the information processing apparatus 212 is about 60° C. to 80° C.

In the liquid immersion cooling system 201 according to Comparative Example 2, the heat exchanger 203 is used to perform the heat exchange between the cooling liquid 211 and the cooling water 217. Therefore, the initial cost of the liquid immersion cooling system 201 according to Comparative Example 2 increases at the time of introducing the facility. As illustrated in FIG. 16, the temperature range L of the cooling water 217 is about 25° C. to 35° C. The temperature range of the outside air needs to be about 0° C. to 25° C. in order to maintain the temperature range L of the cooling water 217 of about 25° C. to 35° C. As a result, in the liquid immersion cooling system 201 according to Comparative Example 2, when the temperature range of the outside air is about 26° C. to 35° C., the temperature range L of the cooling water 217 may not be maintained in the range of about 25° C. to 35° C. For example, in the liquid immersion cooling system 201 according to Comparative Example 2, the upper limit of the temperature of the outside air to cool the information processing apparatus 212 is about 25° C. Accordingly, in the liquid immersion cooling system 201 according to Comparative Example 2, in order to enable the information processing apparatus 212 to be cooled throughout the year, a measure such as, for example, providing a chiller to cool the cooling water 217 together with the heat exchanger 203, is required to cool the information processing apparatus 212. As a result, the initial cost at the time of introducing the facility increases and the operation cost increases.

<First Embodiment>

Figure 1:
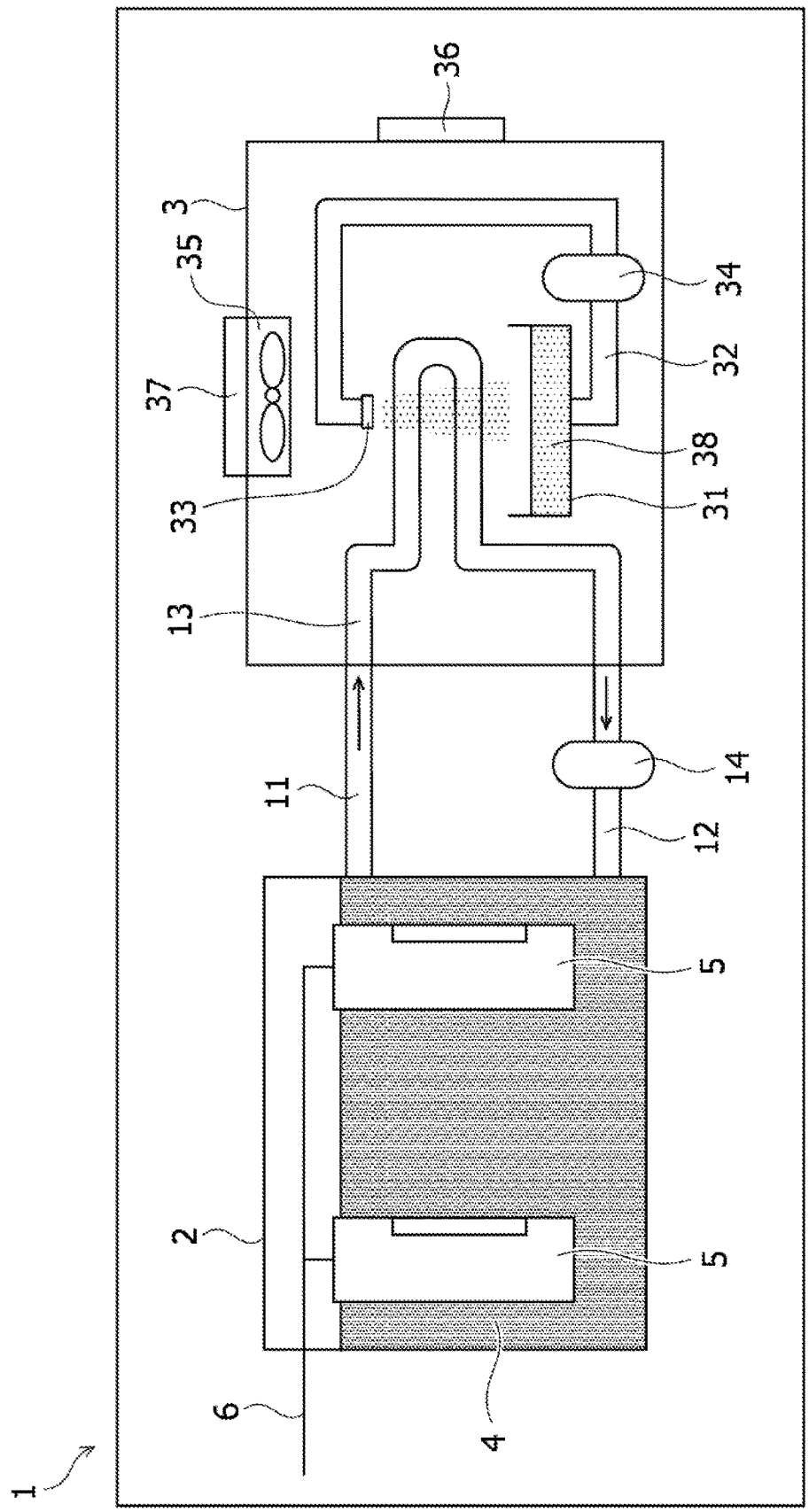
FIG. 1 is a view illustrating an exemplary configuration of a data center according to a first embodiment.

A data center 1 according to a first embodiment will be described with reference to FIGS. 1 to 4. FIG. 1 is a view illustrating an exemplary configuration of a data center 1 according to a first embodiment. The data center 1 includes a liquid immersion tank 2 and a cooling tower 3 coupled to the liquid immersion tank 2. A cooling liquid 4 is accommodated in the liquid immersion tank 2 and one or more information processing apparatuses 5 are held in the cooling liquid 4. In the exemplary configuration illustrated in FIG. 1, the plurality of information processing apparatuses 5 is immersed in the cooling liquid 4. The cooling liquid 4 is an oil such as, for example, poly-α-olefin based synthetic oil (PAO). The information processing apparatus 5 is ICT equipment such as, for example, a personal computer or a server. The information processing apparatus 5 is externally coupled through a network 6.

The liquid immersion tank 2 and the cooling tower 3 are coupled to each other through a pipe 11 and a pipe 12 disposed between the liquid immersion tank 2 and the cooling tower 3. One end of a pipe 13 disposed in the cooling tower 3 is coupled to the pipe 11 and the other end of the pipe 13 is coupled to the pipe 12. Accordingly, the cooling liquid 4 from the liquid immersion tank 2 flows in the pipes 11 to 13, and as a result, the cooling liquid 4 is supplied from the cooling tower 3 to the liquid immersion tank 2. A pump apparatus 14 is installed in the pipe 12. The pump apparatus 14 delivers the cooling liquid 4 from the cooling tower 3 to the liquid immersion tank 2. When the pump apparatus 14 is driven, the cooling liquid 4 in the liquid immersion tank 2 is circulated in the liquid immersion tank 2 and the cooling tower 3 through the pipes 11 to 13. Although the exemplary configuration illustrated in FIG. 1 represents an example in which the pump apparatus 14 is installed in the pipe 12 is illustrated, but the pump apparatus 14 may be installed in the pipe 11 or the pipe 13 without being limited to the exemplary configuration.

The cooling tower 3 is a cooling apparatus of a closed type water sprinkling and blow cooling type. The cooling tower 3 includes the pipe 13, a water tank 31, a water sprinkling pipe 32, a water sprinkling nozzle 33, a water sprinkling pump 34, a blow fan 35, an outside air inlet 36, and an outside air outlet 37. The water tank 31, the water sprinkling pipe 32, the water sprinkling nozzle 33, and the water sprinkling pump 34 are exemplary sprinklers. When the water sprinkling pump 34 installed in the water sprinkling pipe 32 is driven, the water 38 in the water tank 31 is sprinkled from the water sprinkle nozzle 33 to the pipe 13 by passing through the inside of the water sprinkling pipe 32. The cooling tower 3 performs water sprinkling with respect to the pipe 13 to cool the pipe 13 and the cooling liquid 4 flowing in the pipe 13 using the vaporization heat of the water 38. The water 38 sprinkled to the pipe 13 is stored in the water tank 31.

The blow fan 35 performs blowing with respect to the pipe 13. When the blow fan 35 is driven, the outside air is received into the cooling tower 3 from the outside air inlet 36 and the outside air received into the cooling tower 3 is discharged from the outlet 37. The pipe 13 is in the state of being exposed to the outside air received into the cooling tower 3. Accordingly, heat exhaust is performed from the pipe 13 and the cooling liquid 4 flowing in the pipe 13 to the outside air, thereby cooling the pipe 13 and the cooling liquid 4 flowing in the pipe 13.

Figure 2:
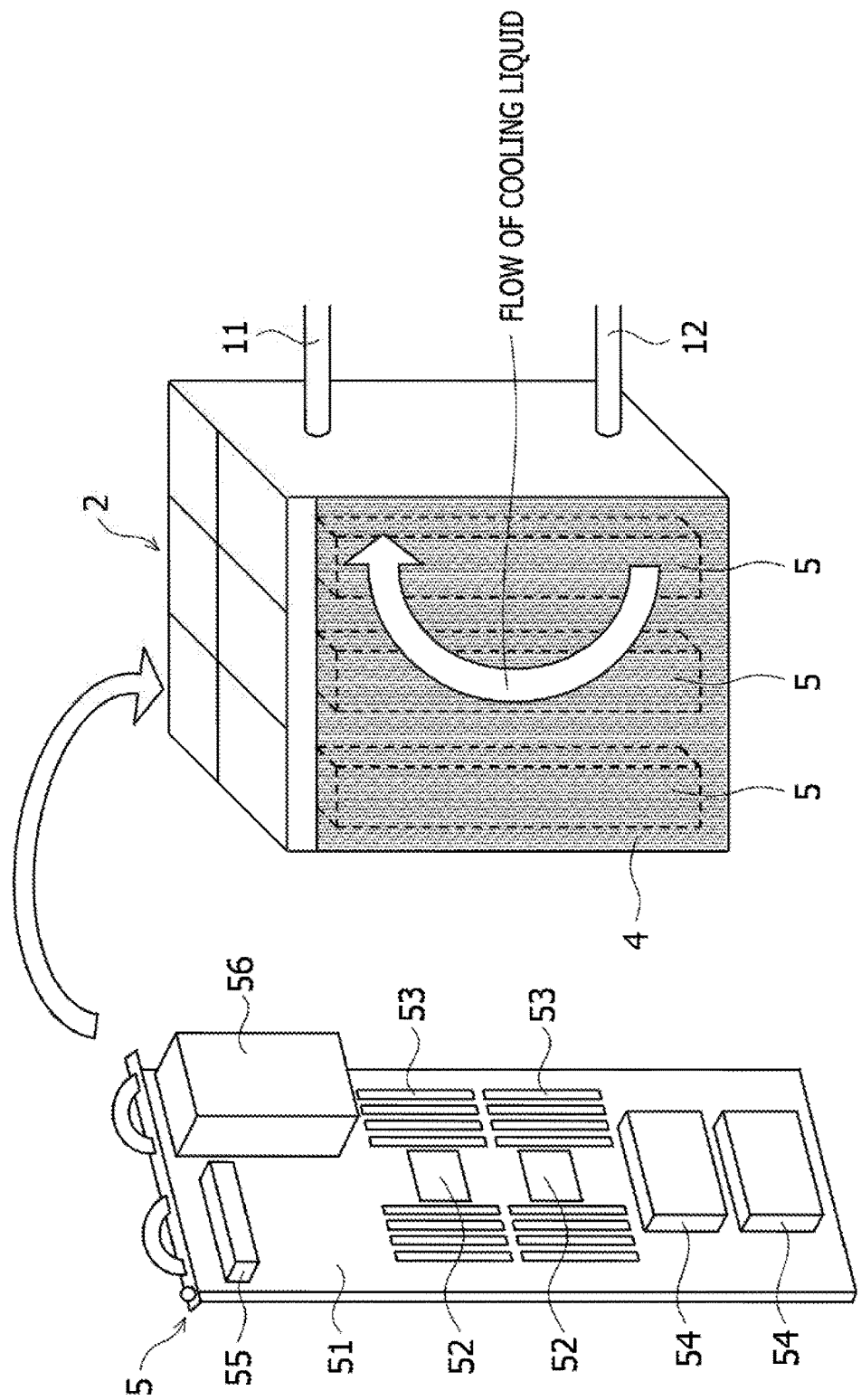
FIG. 2 is a perspective view of a liquid immersion tank and an information processing apparatus.

FIG. 2 is a perspective view illustrating the liquid immersion tank 2 and the information processing apparatus 5. In each information processing apparatus 5, electronic devices including a CPU 52 such as, for example, a processor, a memory 53, a storage 54, an interface unit 55, and a power supply unit (PSU) 56 are mounted on a board 51 in an exposed state. The electronic devices such as, for example, the CPU 52, are mounted one side or both sides of the board 51. The memory 53 is, for example, a read only memory (ROM) or a random access memory (RAM). The storage 54 is one example of a memory device such as, for example, a hard disk drive (HDD) and a solid state drive (SDD). The interface unit 55 is coupled to a LAN or an external interface. For example, a modem or a LAN adapter is adopted in the interface unit 55. When the information processing apparatus 5 is immersed in the cooling liquid 4 in the liquid immersion tank 2, the cooling liquid 4 enters an inside of the electronic devices to affect the operations of the electronic devices. The electronic devices are sealed such that the operations of the electronic devices are not affected even when the information processing apparatus 5 is immersed in the cooling liquid 4 in the liquid immersion tank 2.

An opening/closing type cover is installed on the top of the liquid immersion tank 2. The information processing apparatus 5 is immersed in the cooling liquid 4 in the liquid immersion tank 2 from the top of the liquid immersion tank 2. Since heating elements including the CPU 52 and the like of the information processing apparatus 5 are efficiently directly cooled by the cooling liquid 4 in the liquid immersion tank 2, an exterior chassis which disturbs the circulation of the cooling liquid 4 in the liquid immersion tank 2 is not mounted on the information processing apparatus 5. Further, a fan or the like that cannot operate in the cooling liquid 4 is not mounted on the information processing apparatus 5. A partition or the like is not installed between respective sections in the liquid immersion tank 2 so that the cooling liquid 4 is circulated in the liquid immersion tank 2.

Figure 3A:
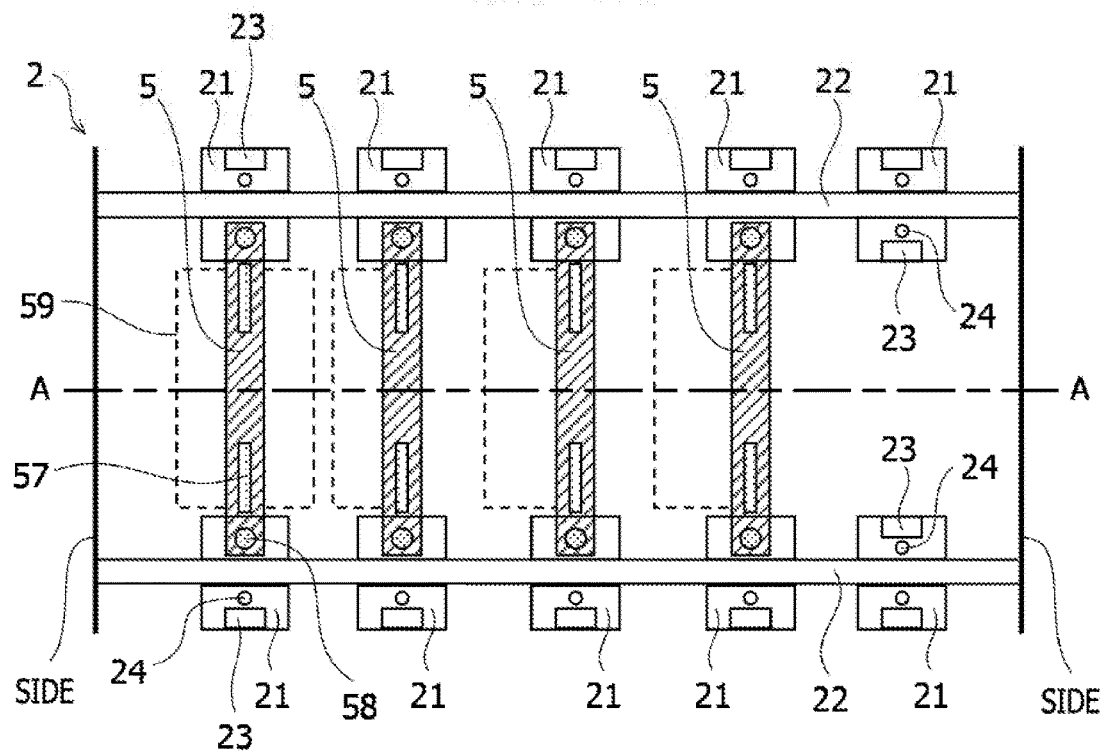
FIG. 3A is a plan view of the liquid immersion tank.
Figure 3B:
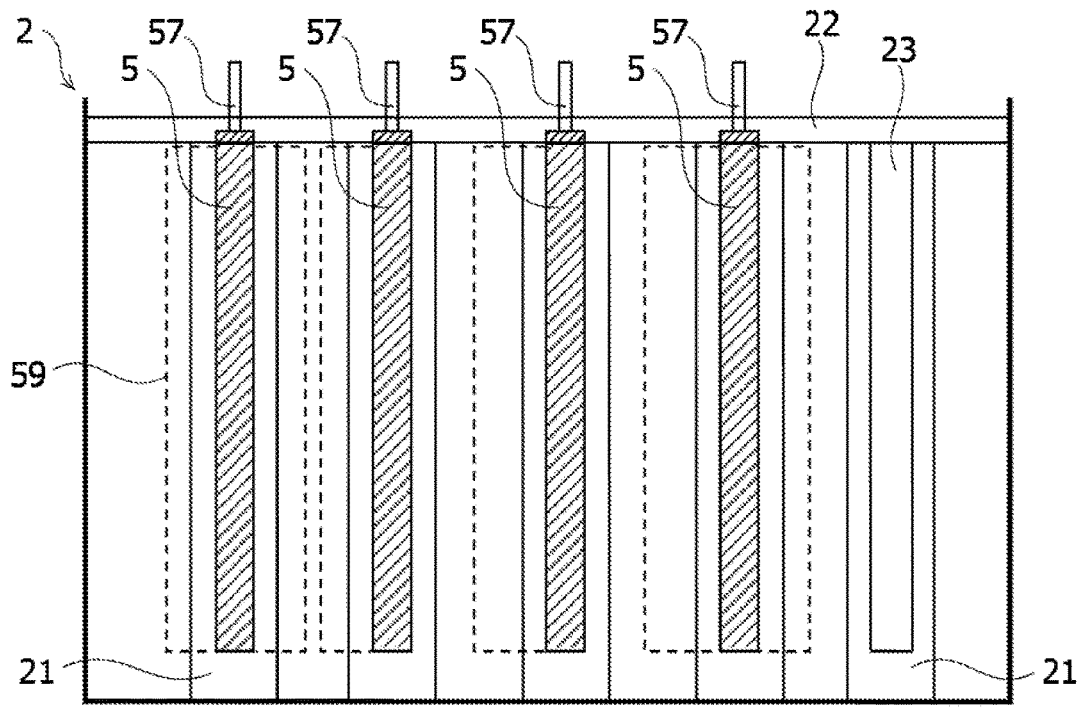
FIG. 3B is a cross-sectional view of the liquid immersion tank taken along an alternate long and short dash line A-A of FIG. 3A.

FIG. 3A is a plan view of the liquid immersion tank 2. FIG. 3B is a cross-sectional view of the liquid immersion tank 2 taken along an alternate long and short dash line A-A of FIG. 3A. FIG. 3C is a side view in the inside of the liquid immersion tank 2. Handles 57 and fixing screws 58 which are lock tools are provided on the top of each information processing apparatus 5. A plurality of holding rails 21 is fixed on the bottom of the liquid immersion tank 2. Fixing fixture 22 configured to straddle a plurality of holding rails 21 are disposed on the top of the liquid immersion tank 2. The fixing fixtures 22 is fixed to the top of the holding rail 21 and fixed to the side surfaces of the liquid immersion tank 2. Mounting grooves (cut-out portions) 23 are formed on the side surfaces of each holding rail 21 and a screw hole 24 is formed on the top of the holding rail 21.

Both ends of each information processing apparatus 5 are inserted into the mounting grooves 23 of the holding rails 21 and the fixing screws 58 of the information processing apparatus 5 are fitted into the screw holes 24 of the holding rails 21 in order to hold the information processing apparatus 5. Because the mounting grooves 23 of each holding rail 21 do not extend onto the bottom of the liquid immersion tank 2, a space is formed between a lower part of the information processing apparatus 5 and the bottom of the liquid immersion tank 2. Further, spaces are formed among the plurality of holding rails 21. The cooling liquid 4 passes through the space between the lower part of the information processing apparatus 5 and the bottom of the liquid immersion tank 2 or the spaces among the plurality of holding rails 21. As a result, the cooling liquid 4 is circulated in the liquid immersion tank 2. The handles 57 of the information processing apparatus 5 are pulled up to take out the information processing apparatus 5 from the liquid immersion tank 2. Further, in FIGS. 3A to 3C, each area 59 surrounded by dotted lines is an area on which the electronic devices such as, for example, the CPU 52 are mounted.

FIG. 4 is a view illustrating an exemplary temperature diagram of the data center 1 according to the first embodiment. The temperature range of the outside air is indicated at the right portion of FIG. 4, the temperature range of the cooling liquid 4 is indicated at the central portion of FIG. 4, and the temperature range of the information processing apparatus 5 is indicated at the left portion of FIG. 4. The temperature range of the information processing apparatus 5 may be, for example, the temperature range of the CPU 52. The temperature range A of the outside air is the yearly range of the wet-bulb temperature of the outside air. In the example illustrated in FIG. 4, the temperature range A of the outside air is about 0° C. to 35° C. For example, the range of the wet-bulb temperature of the outside air at a first time such as, for example, the summer is about 25° C. to 35° C. and the range of the wet-bulb temperature of the outside air at a second time such as, for example, the winter, is 0° C. to 10° C. The temperature range B of the cooling liquid 4 is a temperature range which may be taken by the cooling liquid 4 at the first time. In the example illustrated in FIG. 4, the temperature range B of the cooling liquid 4 is about 35° C. to 45° C. The temperature range C of the cooling liquid 4 is a temperature range which may be taken by the cooling liquid 4 at the second time. In the example illustrated in FIG. 4, the temperature range C of the cooling liquid 4 is about 10° C. to 20° C. As illustrated in FIG. 4, the temperature of the cooling liquid 4 is changed according to a change in wet-bulb temperature of the outside air. Accordingly, the cooling liquid 4 may be supplied from the cooling tower 3 to the liquid immersion tank 2 at the temperature of the cooling liquid 4, which corresponds to the change in wet-bulb temperature of the outside air.

The temperature range D of the information processing apparatus 5 is the temperature range which may be taken by the information processing apparatus 5 at the first time. In the example illustrated in FIG. 4, the temperature range D of the information processing apparatus 5 is about 35° C. to 80° C. The temperature range E of the information processing apparatus 5 is the temperature range which may be taken by the information processing apparatus 5 at the second time. In the example illustrated in FIG. 4, the temperature range E of the information processing apparatus 5 is about 10° C. to 55° C. As illustrated in FIG. 4, the temperature of the information processing apparatus 5 is changed according to the change in temperature of the cooling liquid 4. Accordingly, the cooling liquid 4 is supplied from the cooling tower 3 to the liquid immersion tank 2 at the temperature of the cooling liquid 4, which corresponds to the change in wet-bulb temperature of the outside air to cool the information processing apparatus 5 by the cooling liquid 4 cooled according to the change in wet-bulb temperature of the outside air. As described above, the information processing apparatus 5 is cooled according to the change in wet-bulb temperature of the outside air to configure a cooling environment of the information processing apparatus 5 as a better environment.

In the liquid immersion cooling system 101 according to Comparative Example 1, the heat exchanger 103 is used to perform the heat exchange between the cooling liquid 111 and the cooling water. In the liquid immersion cooling system 201 according to Comparative Example 2, the heat exchanger 203 is used to perform the heat exchange between the cooling liquid 211 and the cooling water 217. In the data center 1 according to the first embodiment, since the heat exchanger is not used to perform the heat exchange between the cooling liquid 4 and the cooling water, the initial cost at the time of introduction or the operation cost may be reduced without performing the heat exchange between the cooling liquid 4 and the cooling water.

<Second Embodiment>

Figure 5:
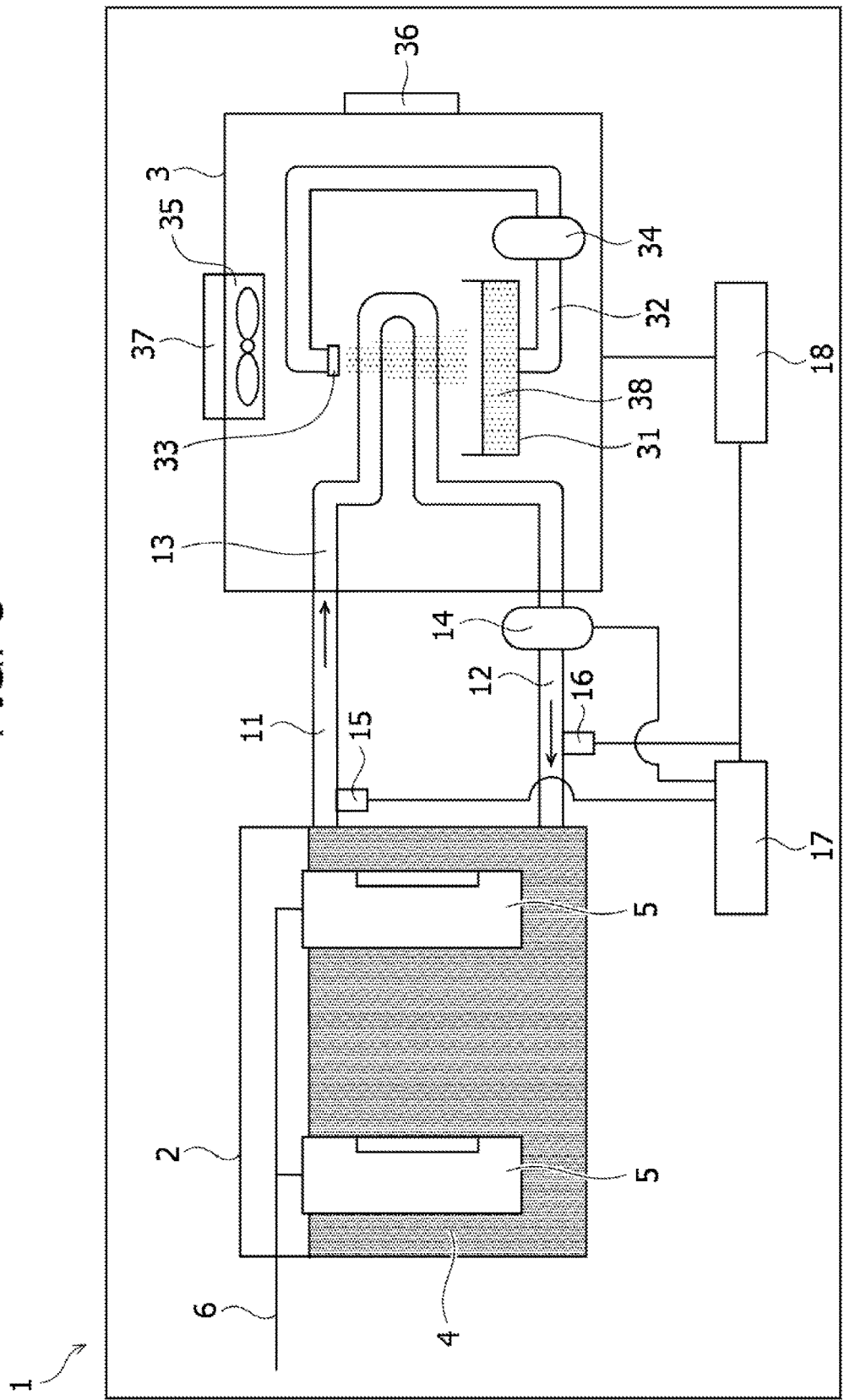
FIG. 5 is a view illustrating an exemplary configuration of a data center according to a second embodiment.

The data center 1 according to the second embodiment will be described with reference to FIGS. 5 to 11. Meanwhile, the same reference numerals as the first embodiment refer to the same components as the first embodiment and descriptions thereof will be omitted. FIG. 5 is a view illustrating an exemplary configuration of a data center 1 according to the second embodiment. The data center 1 illustrated in FIG. 5 additionally includes temperature sensors 15 and 16 and controllers 17 and 18 as compared with the data center 1 illustrated in FIG. 1. The temperature sensor 15 measures a first temperature T1 which is the temperature of the cooling liquid 4 from the liquid immersion tank 2. The temperature sensor 15 is one example of a first temperature measuring unit. The temperature sensor 16 measures a second temperature T2 which is the temperature of the cooling liquid 4 from the cooling tower 3. The temperature sensor 16 is one example of a second temperature measuring unit.

The controller 17 controls a flow rate of the pump apparatus 14 based on a temperature difference (differential) between the first temperature T1 and the second temperature T2. The controller 17 is one example of a pump controller. The controller 17 controls the flow rate of the pump apparatus 14 by outputting a control signal to the pump apparatus 14, and as a result, the flow rate of the cooling liquid 4 is controlled. The controller 17 may control the flow rate of the pump apparatus 14 by controlling, for example, a pump rotation number, a pump rotation rate, or a frequency. The pump rotation number is the number of revolutions of the pump apparatus 14 per unit time. The pump rotation rate is a value obtained by dividing the number of revolutions of the pump apparatus 14 per minute by the maximum RPM of the pump apparatus 14. The frequency is a frequency of an inverter coupled to the pump apparatus 14.

The controller 18 controls the cooling tower 3 based on the second temperature T2. The controller 18 is one example of a cooling apparatus controller. The controller 18 controls the operation of the cooling tower 3 by outputting the control signal to the cooling tower 3 to control the temperature of the cooling liquid 4 supplied to the liquid immersion tank 2 from the cooling tower 3. The controller 18 may control the temperature of the cooling liquid 4 supplied from the cooling tower 3 to the liquid immersion tank 2 by controlling, for example, the operation rate of the cooling tower 3. When the cooling tower 3 operates, the water sprinkling pump 34 and the blow fan 35 are driven and when the cooling tower 3 stops, the water sprinkling pump 34 and the blow fan 35 stop.

The controllers 17 and 18 include a CPU, memories, such as, for example, a read only memory (ROM) and a random access memory (RAM), or the like. The controllers 17 and 18 execute various processings according to a computer program developed to be executed in the memory. The CPU is also called a processor. However, the CPU may having a multiprocessor configuration, without being limited to a single processor. Further, a single CPU coupled to a single socket may have a multi-core configuration. The controllers 17 and 18 may be, for example, a server or a personal computer coupled with the cooling tower 3 through a network. Further, the controllers 17 and 18 may be a control device installed in the cooling tower 3. Although FIG. 5 illustrates an example in which the controller 17 and the controller 18 are separate devices is illustrated, the controller 17 and the controller 18 may be a single device without being limited to the example illustrated in FIG. 5.

<Control Flow of Flow Rate of Pump Apparatus 14>

Figure 6:
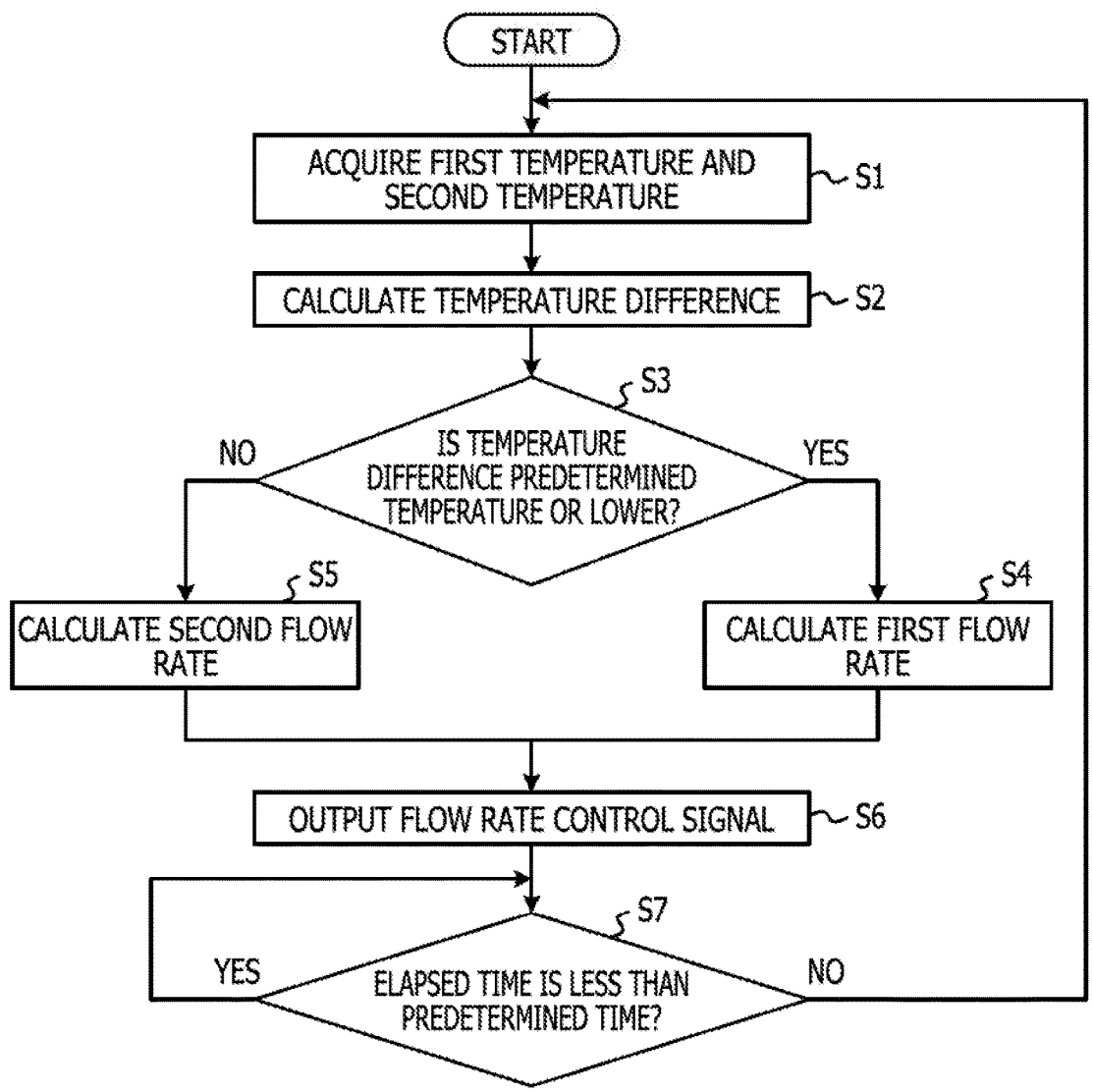
FIG. 6 is a view illustrating an exemplary control flow of a flow rate of a pump apparatus.

FIG. 6 is a view illustrating an exemplary control flow of a flow rate of the pump apparatus 14. The control flow illustrated in FIG. 6 may start based on an instruction from a user or may start, triggered by the supply of power to the information processing apparatus 5. The controller 17 acquires the first temperature T1 from the temperature sensor 15 and acquires the second temperature T2 from the temperature sensor 16 (step S1). The controller 17 calculates a temperature difference (T1−T2) between the first temperature T1 and the second temperature T2 (step S2). In this case, a value obtained by subtracting the second temperature T2 from the first temperature T1 is determined as the temperature difference (T1−T2) between the first temperature T1 and the second temperature T2. The controller 17 determines whether the temperature difference calculated in step S2 is a temperature V1 or less (step S3). The temperature V1 is, for example, 5° C., but may be other values without being limited to the value.

When the temperature difference (T1−T2) calculated in step S2 is the temperature V1 or lower (step S3: YES), the controller 17 calculates a first flow rate for the pump apparatus 14 (step S4). Meanwhile, when the temperature difference (T1−T2) calculated in step S2 is higher than the temperature V1 (step S3: NO), the controller 17 calculates a second flow rate for the pump apparatus 14 (step S5). The second flow rate is a larger value than the first flow rate. The controller 17 calculates the first flow rate and the second flow rate according to the temperature difference (T1−T2). For example, when the temperature difference (T1−T2) is smaller, the controller 17 calculates a relatively smaller flow rate as the second flow rate and when the temperature difference (T1−T2) is larger, the controller 17 calculates a relative larger flow rate as the second flow rate.

Figure 7:
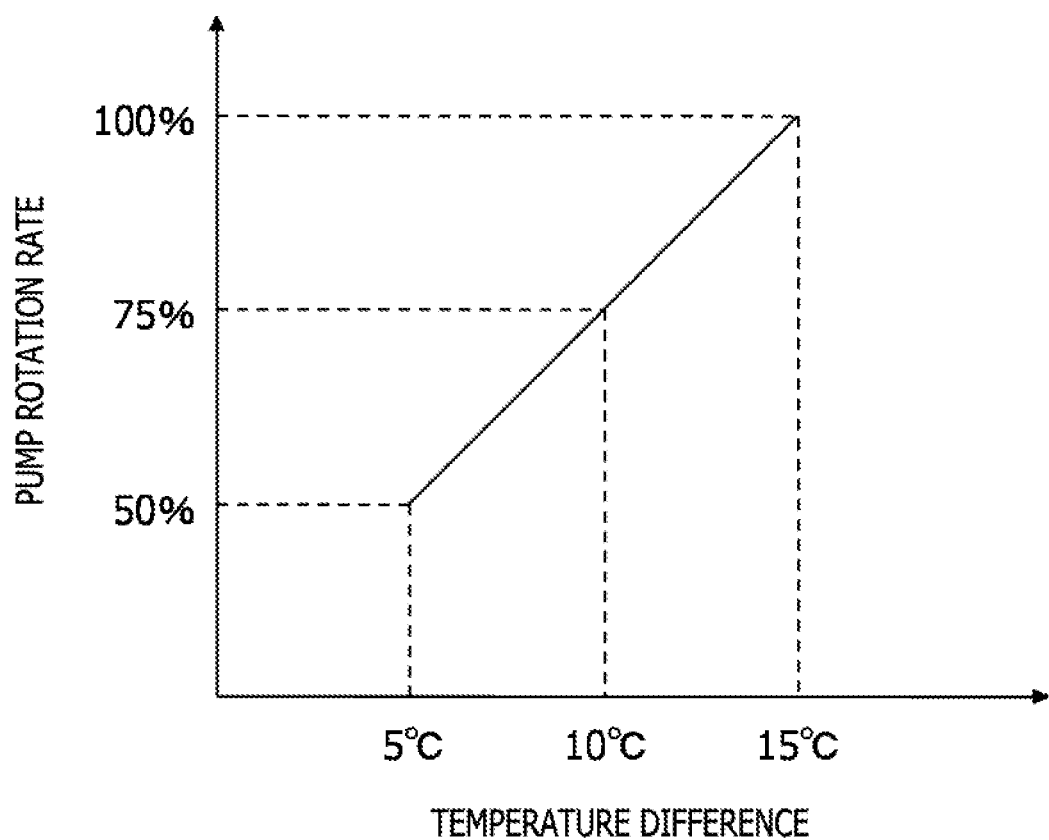
FIG. 7 is a characteristic view illustrating a relationship between a temperature difference between a first temperature and a second temperature and a pump rotation rate.

The controller 17 may calculate the first flow rate and the second flow rate based on a proportional characteristic illustrated in FIG. 7. FIG. 7 illustrates one example of a case in which the pump rotation rate is used as the first flow rate and the second flow rate. A vertical axis of FIG. 7 represents a pump rotation rate and a horizontal axis of FIG. 7 represents a temperature difference (T1−T2) between the first temperature T1 and the second temperature T2. Data of the proportional characteristic illustrated in FIG. 7 is stored in the memory of the controller 17. For example, when the temperature V1 is 5° C. and the temperature difference (T1−T2) calculated in step S2 is 5° C., the controller 17 may calculate the pump rotation rate of 50% as the first flow rate based on the proportional characteristic illustrated in FIG. 7. For example, when the temperature V1 is 5° C. and the temperature difference (T1−T2) calculated in step S2 is 10° C., the controller 17 may calculate the pump rotation rate of 75% as the second flow rate based on the proportional characteristic illustrated in FIG. 7. For example, when the temperature V1 is 5° C. and the temperature difference (T1−T2) calculated in step S2 is 15° C., the controller 17 may calculate the pump rotation rate of 100% as the second flow rate based on the proportional characteristic illustrated in FIG. 7.

The controller 17 may calculate the first flow rate and the second flow rate based on the following Equation 1 and Equation 2. The following Equation 1 and Equation 2 correspond to one example of a case in which the temperature V1 is 5° C., the pump rotation rate α is calculated as the first flow rate, and the pump rotation rate β is calculated as the second flow rate.

$$\text{pump rotation rate } \alpha = 50\% \quad \text{Equation 1:}$$

$$\text{pump rotation rate } \beta = (5 \times (\text{temperature difference } (T1-T2)-5)+50)\% \quad \text{Equation 2:}$$

When a value calculated by Equation 2 described above is more than 100%, the controller 17 may set the pump rotation rate β as 100%.

The controller 17 converts the first flow rate or the second flow rate into a flow rate control signal and outputs the flow rate control signal to the pump apparatus 14 (step S6). The flow rate control signal is input into the pump apparatus 14, and as a result, the first flow rate or the second flow rate is set in the pump apparatus 14. The controller 17 determines whether an elapsed time after the flow rate control signal is output is less than a predetermined time (step S7). The predetermined time is, for example, 10 minutes, but is not limited thereto and may be other values. When the elapsed time reaches the predetermined time (step S7: NO), the controller 17 proceeds the processing to step S1. Meanwhile, when the elapsed time is less than the predetermined time (step S7: YES), the controller 17 repeats the processing of step S7 until the elapsed time reaches the predetermined time. When the flow rate of the pump apparatus 14 is changed, a predetermined time elapsed, and as a result, the temperature difference (T1−T2) is changed. For that reason, the controller 17 determines whether the elapsed time after the flow rate control signal is output is less than the predetermined time, so that the flow rate of the pump apparatus 14 is reflected and the controller waits until the temperature difference (T1−T2) is changed.

When the temperature difference (T1−T2) is the temperature V1 or lower, the controller 17 sets the first flow rate in the pump apparatus 14. When the first flow rate is set in the pump apparatus 14, the cooling liquid 4 is circulated between the liquid immersion tank 2 and the cooling tower 3 without staying such that the occurrence of a phenomenon that the temperature of the cooling liquid 4 locally increases (hot spot) is suppressed. When the temperature difference (T1−T2) exceeds the temperature V1, the controller 17 sets the second flow rate, which is larger than first flow rate, in the pump apparatus 14. Since the controller 17 calculates the second flow rate according to the temperature difference (T1−T2), the flow rate of the cooling liquid 4, which is circulated between the liquid immersion tank 2 and the cooling tower 3, increases or decreases according to the temperature difference (T1−T2). The controller 17 may make the temperature difference (T1−T2) converge within a predetermined range by increasing or decreasing the flow rate of the pump apparatus 14 based on the temperature difference (T1−T2).

For example, when the use rate of the CPU 52 of the information processing apparatus 5 increases and a heat emission amount of the CPU 52 of the information processing apparatus 5 thus increases, the first temperature T1 increases, and as a result, the temperature difference (T1−T2) increases. Further, for example, when the wet-bulb temperature of the outside air decreases, the second temperature T2 decreases, and as a result, the temperature difference (T1−T2) increases. When the temperature difference (T1−T2) is the temperature V1 or more, the second flow rate is set in the pump apparatus 14. When the second flow rate is set in the pump apparatus 14 and the flow rate of the pump apparatus 14 thus increases, the flow rate of the cooling liquid 4, which is circulated between the liquid immersion tank 2 and the cooling tower 3, increases. As a result, heat exhaust of the CPU 52 of the information processing apparatus 5 is facilitated. When the flow rate of the pump apparatus 14 increases and the temperature difference (T1−T2) is thus less than the temperature V1, the first flow rate is set in the pump apparatus 14. Power consumption of the pump apparatus 14 is suppressed by changing the second flow rate to the first change rate, and as a result, the operation cost of the data center 1 is reduced.

<Control Flow of Cooling Tower 3>

Figure 8:
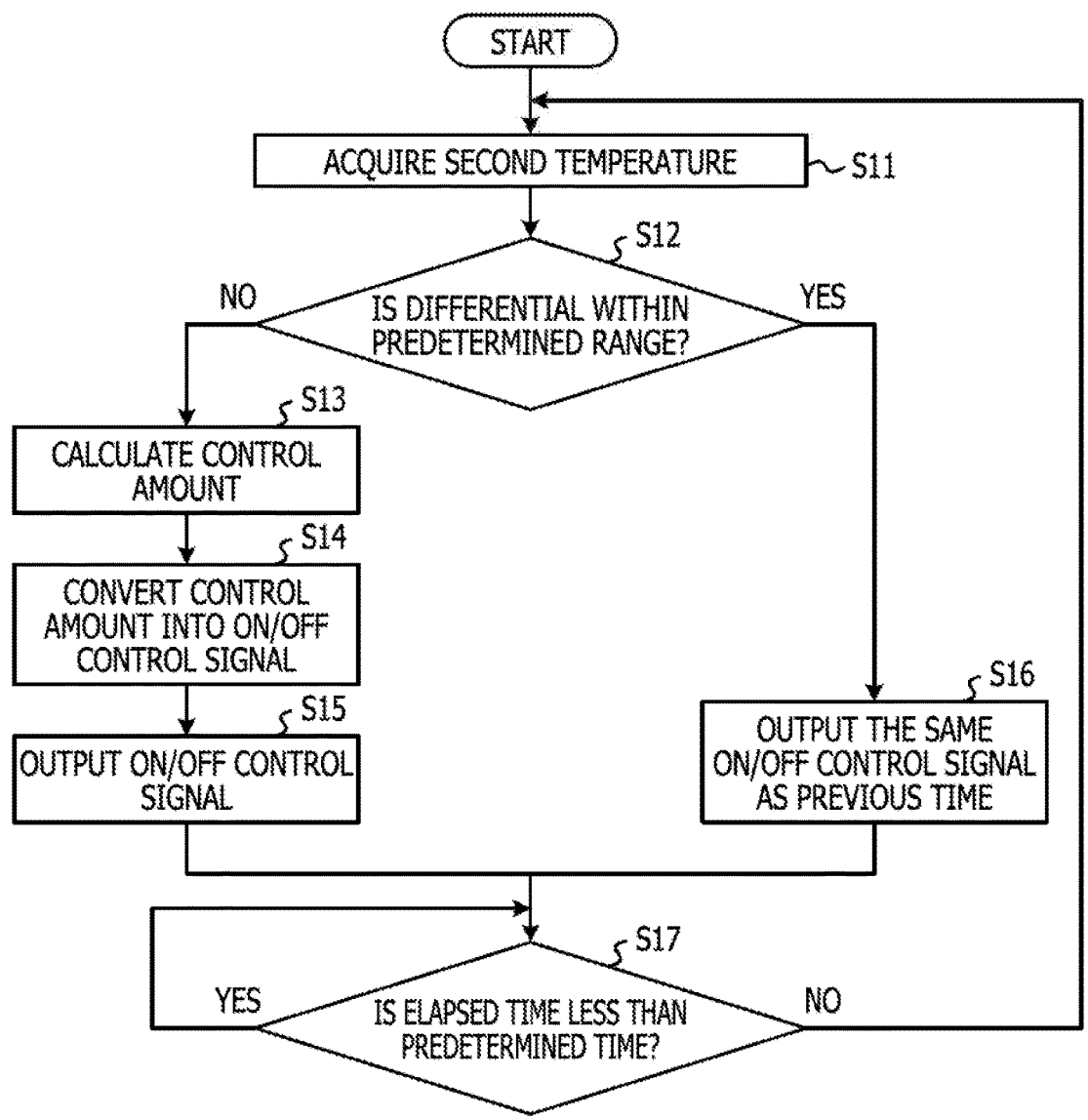
FIG. 8 is a view illustrating an exemplary control flow of a cooling tower.

FIG. 8 is a view illustrating an exemplary control flow of the cooling tower 3. The control flow illustrated in FIG. 8 may start based on the instruction from the user or start, triggered by the supply of the power to the information processing apparatus 5. A controller 18 acquires the second temperature T2 from the temperature sensor 16 (step S11). The controller 18 compares the second temperature T2 and a target temperature V2 in order to determine whether a differential (T2−V2) between the second temperature T2 and the target temperature V2 is within a predetermined range (step S12). For example, the target temperature V2 is about 30° C., but may be other values without being limited thereto. For example, a predetermined range is about −0.5° C. to +0.5° C., but may be other values without being limited thereto.

Figure 9:
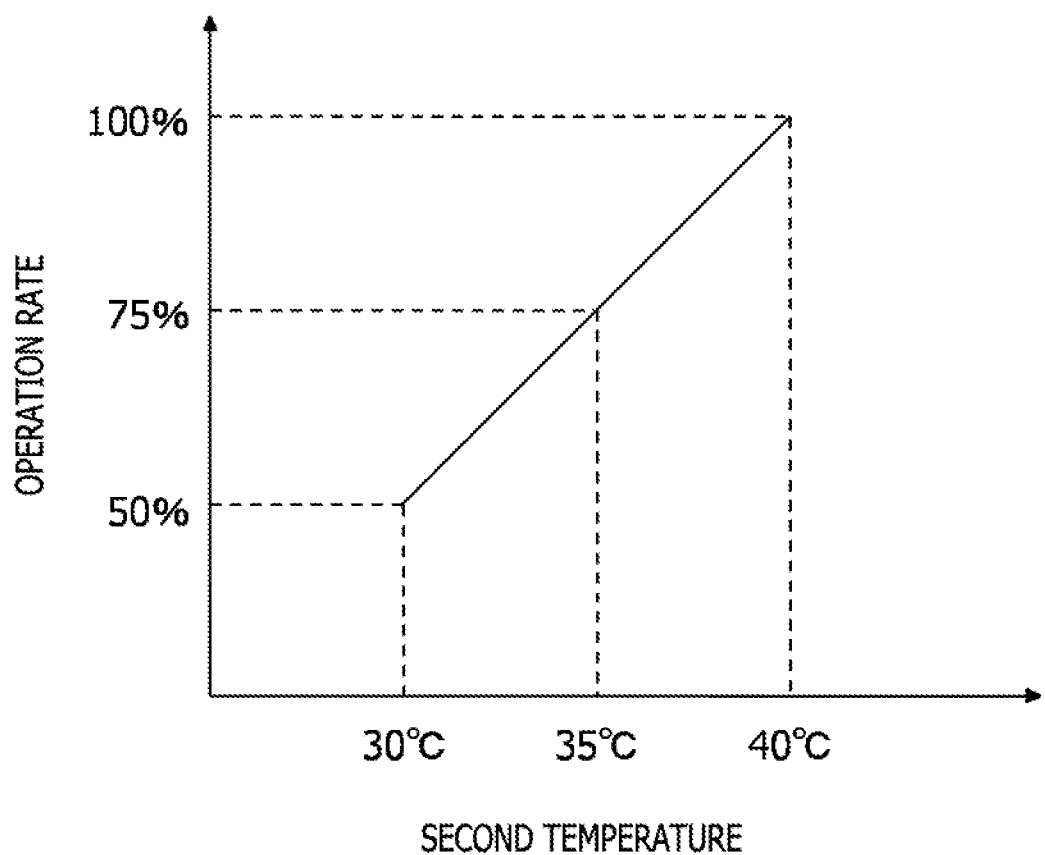
FIG. 9 is a characteristic view illustrating a relationship between the second temperature and an operation rate of a cooling tower.

When the differential (T2−V2) is not within the predetermined range (step S12: NO), the controller 18 calculates a control amount of the cooling tower 3 (step S13). The controller 18 may calculate the control amount of the cooling tower 3 based on the proportional characteristic illustrated in FIG. 9. FIG. 9 illustrates one example of a case in which operate rate of the cooling tower 3 is used as the control amount of the cooling tower 3. The vertical axis of FIG. 9 represents the operation rate of the cooling tower 3 and the horizontal axis of FIG. 9 represents the second temperature T2. In the example illustrated in FIG. 9, when the second temperature T2 is 30° C., the operation rate of the cooling tower 3 is 50%, when the second temperature T2 is 35° C., the operation rate of the cooling tower 3 is 75%, and when the second temperature T2 is 40° C., the operation rate of the cooling tower 3 is 100%. The data of the proportional characteristic illustrated in FIG. 9 is stored in the memory of the controller 18. When the operation rate of the cooling tower 3 is 50%, an operation time of the cooling tower 3 per unit time is 50% and a stop time of the cooling tower 3 per unit time is 50%.

For example, when the target temperature V2 is 35° C. and the second temperature T2 is 40° C., the controller 18 calculates the operation rate of the cooling tower 3 of 100% as the control amount of the cooling tower 3 based on the proportional characteristic illustrated in FIG. 9. In this case, the controller 18 calculates a value (the operation rate of the cooling tower 3=100%) larger than the value (the operation rate of the cooling tower 3=75%) corresponding to the target temperature V2 of 35° C. as the control amount of the cooling tower 3. For example, when the target temperature V2 is 35° C. and the second temperature T2 is 30° C., the controller 18 calculates the operation rate of the cooling tower 3 of 50% as the control amount of the cooling tower 3 based on the proportional characteristic illustrated in FIG. 9. In this case, the controller 18 calculates a value (the operation rate of the cooling tower 3=50%) smaller than the value (the operation rate of the cooling tower 3=75%) corresponding to the target temperature V2 of 35° C. as the control amount of the cooling tower 3. As described above, the controller 18 calculates the control amount of the cooling tower 3 so that the operation rate of the cooling tower 3 is higher than a predetermined value when the second temperature T2 is higher than the target temperature V2. Further, the controller 18 calculates the control amount of the cooling tower 3 so that the operation rate of the cooling tower 3 is lower than the predetermined value when the second temperature T2 is lower than the target temperature V2. For example, the predetermined value is the operation rate of the cooling tower 3, which corresponds to the target temperature V2.

The controller 18 may calculate the control amount of the cooling tower 3 based on the following Equation 3. The following Equation 3 corresponds to one example of the case in which the operation rate of the cooling tower 3 is calculated as the control amount of the cooling tower 3.

operation rate of cooling tower 3=(5×(second temperature *T*2−target temperature *V*2)+50)%  Equation 3:

When a value calculated by Equation 3 is more than 100%, the controller 18 may calculate the operation rate of the cooling tower 3 as 100%. When the value calculated by Equation 3 is a negative value, the controller 18 may calculate the operation rate of the cooling tower 3 as 0%.

The controller 18 calculates the control amount of the cooling tower 3 so that the operation rate of the cooling tower 3 increases when the second temperature T2 is higher than the target temperature V2. For example, the controller 18 calculates the control amount of the cooling tower 3 so that the operation rate of the cooling tower 3 is higher than a predetermined value (for example, 50%) when the second temperature T2 is higher than the target temperature V2. Further, the controller 18 calculates the control amount of the cooling tower 3 so that the operation rate of the cooling tower 3 decreases when the second temperature T2 is lower than the target temperature V2. For example, the controller 18 calculates the control amount of the cooling tower 3 so that the operation rate of the cooling tower 3 is lower than the predetermined value (for example, 50%) when the second temperature T2 is lower than the target temperature V2.

The controller 18 converts the control amount of the cooling tower 3 into an ON/OFF control signal (step S14). The ON/OFF control signal is a control signal for starting (ON) or stopping (OFF) the operation of the cooling tower 3. The controller 18 outputs the ON/OFF control signal to the cooling tower 3 (step S15). The ON/OFF control signal is input to the cooling tower 3, and as a result, the control amount of the cooling tower 3 is set in the cooling tower 3.

When the differential (T2−V2) is within the predetermined range (step S12: YES), the controller 18 outputs the same ON/OFF control signal as the ON/OFF control signal which is previously output to the cooling tower 3 (step S16). The ON/OFF control signal is input into the cooling tower 3, and as a result, the operation rate of the cooling tower 3 is set in the cooling tower 3. Further, when the ON/OFF control signal is first output to the cooling tower 3, the controller 18 proceeds the processing to step S13. When the differential (T2−V2) is within the predetermined range, the second temperature T2 coincides with or is proximate to the target temperature V2, and as a result, the controller 18 outputs the same ON/OFF control signal as the ON/OFF control signal previously output to the cooling tower 3 without changing the ON/OFF control signal.

The controller 18 determines whether an elapsed time after the ON/OFF control signal is output is less than a predetermined time (step S17). The predetermined time is, for example, 10 minutes, but may be other values without being limited thereto. When the elapsed time reaches the predetermined time (step S7: NO), the controller 18 proceeds the processing to step S11. Meanwhile, when the elapsed time is less than the predetermined time (step S17: YES), the controller 18 repeats the processing of step S17 until the elapsed time reaches the predetermined time. When the control amount of the cooling tower 3 is changed, a predetermined time elapsed, and as a result, the second temperature T2 is changed. As a result, the controller 18 determines whether the elapsed time after the ON/OFF control signal is output is less than the predetermined time, so that the control amount of the cooling tower 3 is reflected and the controller 18 waits until the second temperature T2 is changed.

When the differential (T2−V2) between the second temperature T2 and the target temperature V2 is not within the predetermined range and further, the second temperature T2 is lower than the target temperature V2, the controller 18 calculates a first control amount to set the first control amount in the cooling tower 3. The first control amount is set in the cooling tower 3, and as a result, the operation rate of the cooling tower 3 is smaller than a predetermined value and the second temperature T2 increases. When the differential (T2−V2) between the second temperature T2 and the target temperature V2 is not within the predetermined range and further, the second temperature T2 is higher than the target temperature V2, the controller 18 calculates the second control amount to set the second control amount in the cooling tower 3. The second control amount is set in the cooling tower 3, and as a result, the operation rate of the cooling tower 3 is larger than the predetermined value and the second temperature T2 decreases. The controller 18 controls the cooling tower 3 by calculating the control amount of the cooling tower 3 based on the second temperature T2, and as a result, the differential (T2−V2) between the second temperature T2 and the target temperature V2 is within the predetermined range. Accordingly, the controller 18 controls the cooling tower 3 so that the second temperature T2 and the target temperature V2 coincide with or approximate to each other to constantly control the second temperature T2. Since the cooling liquid 4 having a predetermined temperature is supplied to the liquid immersion tank 2, the information processing apparatus 5 may be cooled by the cooling liquid 4 having the predetermined temperature.

Figure 10:
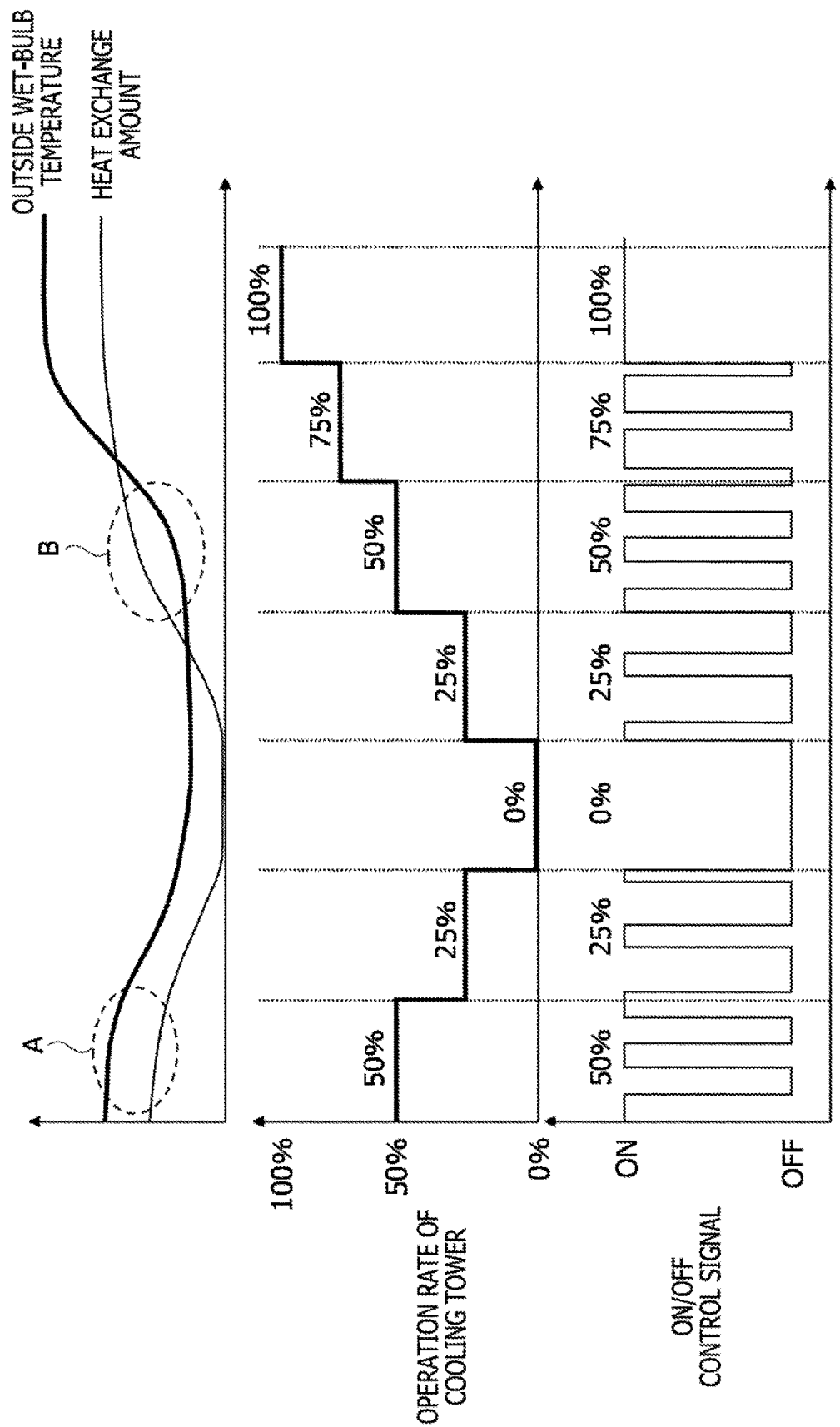
FIG. 10 is a view illustrating an exemplary time chart of an ON/OFF control signal, an operation rate of the cooling tower, an outside air wet-bulb temperature, and a heat exchange amount of the cooling tower.

FIG. 10 is a view illustrating an exemplary time chart of an ON/OFF control signal, an operation rate of the cooling tower 3, an outside air wet-bulb temperature, and a heat exchange amount of the cooling tower 3. The horizontal axis of FIG. 10 represents an elapsed time and an interval where the operation rate of the cooling tower 3 is reflected is set to 10 minutes. Duty ratios of an ON/OFF control signal are indicated at the lower portion of FIG. 10. The operation rates of the cooling tower 3 are indicated in the middle portion of FIG. 10. As illustrated in FIG. 10, the duty ratios of the ON/OFF control signal and the operation rates of the cooling tower 3 correspond to each other. For example, when the duty ratio of the ON/OFF control signal is 50%, the operation rate of the cooling tower 3 is 50%. The change in outside air wet-bulb temperature and the change in heat exchange amount of the cooling tower 3 are indicated in the upper portion of FIG. 10. At a portion indicated by dotted line A and a portion indicated by dotted line B at the upper portion of FIG. 10, the operation rates of the cooling tower 3 are equal to each other as 50%. However, there is a difference in the heat exchange amount of the cooling tower 3 due to a difference in outside air wet-bulb temperature. This is because when the outside air wet-bulb temperature is low, the heat exchange amount of the cooling tower 3 increases, and when the outside air wet-bulb temperature is high, the heat exchange amount of the cooling tower 3 decreases.

The controller 18 controls the cooling tower 3 based on the second temperature T2 to supply the cooling liquid 4 from the cooling tower 3 to the liquid immersion tank 2 in response to the change in outside air wet-bulb temperature. For example, when the outside air wet-bulb temperature decreases, the temperature of the cooling liquid 4 supplied from the cooling tower 3 to the liquid immersion tank 2 decreases. In this case, the operation rate of the cooling tower 3 decreases and the temperature of the cooling liquid 4 supplied from the cooling tower 3 to the liquid immersion tank 2 increases so as to constantly control the second temperature T2. Since the operation rate of the cooling tower 3 decreases, the power consumption of the cooling tower 3 decreases, thereby reducing the operation cost of the data center 1.

Figure 11:
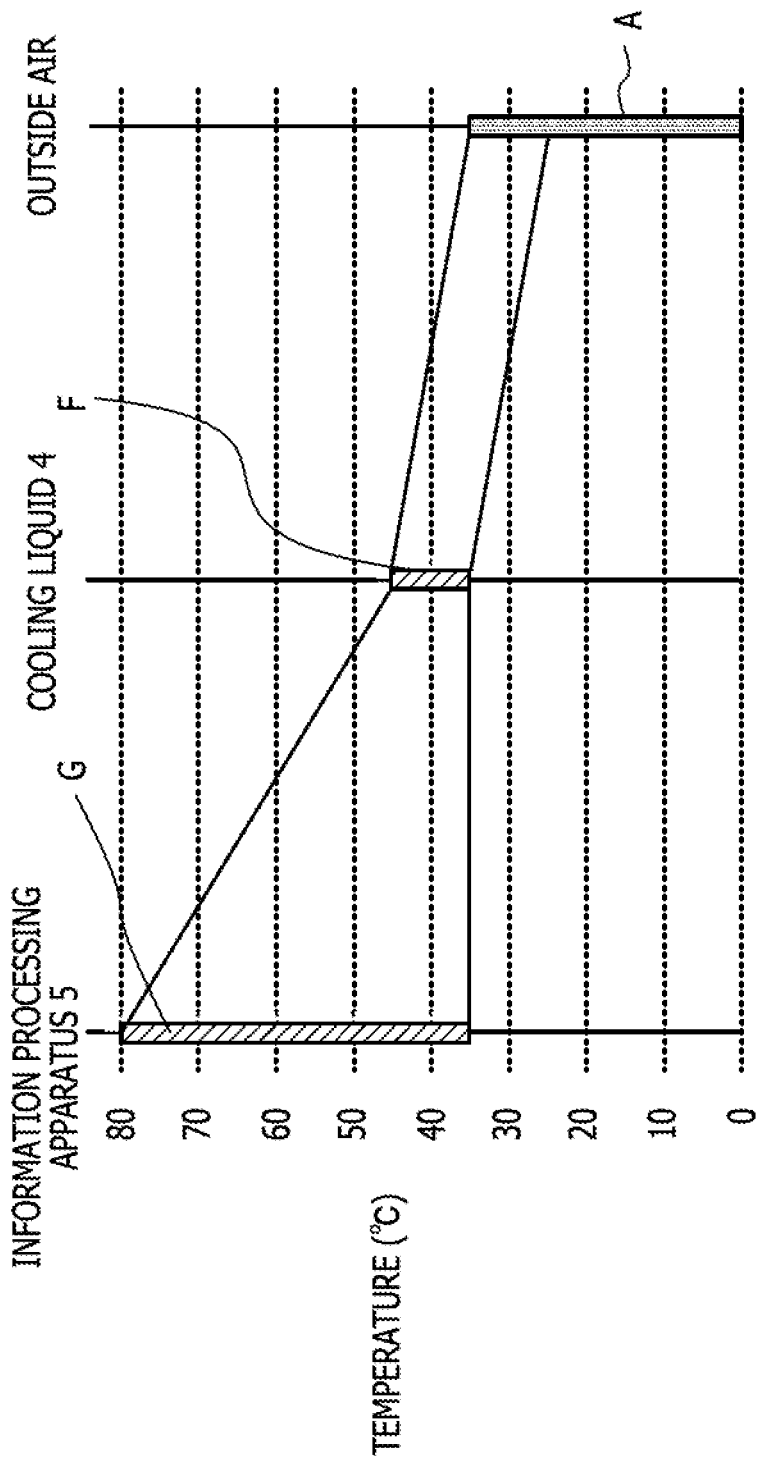
FIG. 11 is a view illustrating an exemplary temperature diagram of the data center according to the second embodiment.

FIG. 11 is a view illustrating an exemplary temperature diagram of a data center 1 according to a second embodiment. The temperature range of the outside air is represented at the right portion of FIG. 11, the temperature range of the cooling liquid 4 is represented at a central portion of FIG. 11, and the temperature range of the information processing apparatus 5 is represented at the left portion of FIG. 11. The temperature range of the information processing apparatus 5 may be, for example, the temperature range of the CPU 52. The temperature range A of the outside air is a range which may be taken by the outside air, for example, the yearly range of the wet-bulb temperature of the outside air. In the example illustrated in FIG. 11, the temperature range A of the outside air is about 0° C. to 35° C. The temperature range F of the cooling liquid 4 is the temperature range which may be taken by the cooling liquid 4. In the example illustrated in FIG. 11, the temperature range F of the cooling liquid 4 is about 36° C. to 46° C. Accordingly, in the example illustrated in FIG. 11, the lowest temperature which may be taken by the first temperature T1 is about 36° C. and the highest temperature which may be taken by the second temperature T2 is about 46° C. The temperature range G of the information processing apparatus 5 is the temperature range which may be taken by the information processing apparatus 5. In the example illustrated in FIG. 11, the temperature range G of the information processing apparatus 5 is about 36° C. to 80° C. In the example illustrated in FIG. 11, the temperature range F of the cooling liquid 4 is included in the temperature range G of the information processing apparatus 5. The present disclosure is not limited to the example illustrated in FIG. 11, and a part of the temperature range which may be taken by the cooling liquid 4 and a part of the temperature range which may be taken by the information processing apparatus 5 may overlap with each other. For example, parts in the temperature range which may be taken by the cooling liquid 4 and the temperature range which may be taken by the information processing apparatus 5 may overlap with each other. In the example illustrated in FIG. 11, the temperature range A of the outside air does not overlap with any of the temperature range F of the cooling liquid 4 and the temperature range G of the information processing apparatus 5. The present disclosure is not limited to the example illustrated in FIG. 11, and a part of the temperature range which may be taken by the outside air and a part of the temperature range which may be taken by the cooling liquid 4 may overlap with each other.

In the liquid immersion cooling system 101 according to Comparative Example 1, the heat exchanger 103 is used to perform the heat exchange between the cooling liquid 111 and the cooling water. In the liquid immersion cooling system 201 according to Comparative Example 2, the heat exchanger 203 is used to perform the heat exchange between the cooling liquid 211 and the cooling water 217. In the data center 1 according to the second embodiment, because the heat exchanger is not used to perform the heat exchange between the cooling liquid 4 and the cooling water, the initial cost at the time of introduction or the operation cost may be reduced without performing the heat exchange between the cooling liquid 4 and the cooling water.

It has been confirmed that the increase in leakage current and the increase in power consumption of the information processing apparatus 5 by the increase in temperature of the cooling liquid 4 in the data center 1 according to the first and second embodiments are not a problem in an actual driving state of the data center 1. Further, it has been confirmed that a temperature which may be taken by the information processing apparatus 5 in the data center 1 according to the first and second embodiments is also equal to or lower than a prescribed temperature, and the life-span of the information processing apparatus 5 has no actual problem. Since the temperature of the cooling liquid 4 decreases in the winter season and the like so that the cooling environment of the information processing apparatus 5 may be made better, the increase in leakage current of the information processing apparatus 5 and the increase in power consumption are suppressed in a long-period operation of the data center 1.

In the liquid immersion cooling system 201 according to Comparative Example 2, the upper limit of the temperature of the outside air to cool the information processing apparatus 212 is about 25° C. By the data center 1 according to the first and second embodiments, the upper limit of the outside air which may cool the information processing apparatus 5 may be increased and the information processing apparatus 5 may be cooled throughout the year as compared with the liquid immersion cooling system 201 according to Comparative Example 2. Since the cooling tower 3 is inexpensive, the initial cost at the time of introducing the facility may be suppressed in the data center 1 as compared with the case in which the expensive chiller is introduced. Since the oil such as, for example, the PAO, used as the cooling liquid 4 is inexpensive, the initial cost at the time of introducing the facility may be suppressed in the data center 1 as compared with the case in which expensive Fluorinert is used. The density of Fluorinert is 1880 kg/m$^3$ and the density of the PAO is 833 kg/m$^3$. Since the performance reduction of the pump apparatus 14 may be achieved by using the low-density cooling liquid 4, the initial cost at the time of introducing the facility in the data center 1 may be suppressed.

FIG. 12 is a view illustrating the power of the data center 1 according to the first and second embodiments and the power of the liquid immersion cooling system 101 according to Comparative Example 1. In the example illustrated in FIG. 12, the temperature range of the cooling liquid 4 is about 35° C. to 45° C. and the flow rate of the cooling liquid 4 is about 50 L/min. In the example illustrated in FIG. 12, the temperature range of the cooling liquid 111 is about 35° C. to 45° C. and the flow rate of the cooling liquid 111 is about 50 L/min. As illustrated in FIG. 12, the total power of the liquid immersion cooling system of the data center 1 according to the first and second embodiments is smaller than the total power of the liquid immersion cooling system of the liquid immersion cooling system 101 according to Comparative Example 1 by 3.55 kW. As a result, as illustrated in FIG. 12, the entire power of the data center 1 according to the first and second embodiments is smaller than the entire power of the liquid immersion cooling system 101 according to Comparative Example 1 by 3.55 kW. As a result, the power usage effectiveness (PUE) of the data center 1 according to the first and second embodiments is lower than the PUE of the liquid immersion cooling system 101 according to Comparative Example 1 by 0.237. The PUE is, for example, a value obtained by dividing total power consumption of the ICT equipment and a cooling facility by the power consumption of the ICT equipment.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to an illustrating of the superiority and inferiority of the invention. Although the embodiments of the present disclosure have been described in detail, it should be understood that the various changes, substitutions, and alterations could be made hereto without departing from the spirit and scope of the invention.

What is claimed is:

1. A data center comprising:
a liquid immersion tank that holds an information processing apparatus in a cooling liquid;
a cooling apparatus connected directly to the liquid immersion tank through a pipe through which the cooling liquid flows from the liquid immersion tank to the cooling apparatus to be cooled;
a pump apparatus provided in the pipe to deliver the cooling liquid from the cooling apparatus to the liquid immersion tank through the pipe; and
a controller configured to control a flow rate of the cooling liquid flowing through the pipe between the liquid immersion tank and the cooling apparatus and an operation rate of the cooling apparatus,
a portion of the pipe that passes through the cooling apparatus is continuous without being disconnected and exposed to outside air and a cooling water such that the cooling liquid flowing through the portion of the pipe is cooled directly by the outside air and by the cooling water in the cooling apparatus while continuously flowing through the portion of the pipe without being disconnected,
the pump apparatus delivers the cooling liquid cooled directly by the outside air and the cooling water in the cooling apparatus to the liquid immersion tank via the pipe such that the cooling liquid is cooled directly by the outside air and by the cooling water while being circulated between the liquid immersion tank and the cooling apparatus through the pipe, and
the controller controls the flow rate of the cooling liquid between the liquid immersion tank and the cooling apparatus based on a temperature difference between a first temperature of the cooling liquid flowing from the liquid immersion tank to the cooling apparatus and a second temperature of the cooling liquid flowing from the cooling apparatus to the liquid immersion tank, and controls the operation rate of the cooling apparatus based on the second temperature of the cooling liquid flowing from the cooling apparatus to the liquid immersion tank such that the second temperature of the cooling liquid from the cooling apparatus is maintained within a predetermined range of a target temperature;
wherein the data center further comprises a first temperature sensor that measures the first temperature and a second temperature sensor that measures the second temperature; and
wherein the controller controls the flow rate such that the temperature difference between the first temperature and the second temperature is equal to or lower than a predetermined temperature.

2. The data center according to claim 1, wherein a first temperature range which is capable of being taken by the information processing apparatus and a second temperature range which is capable of being taken by the cooling liquid partially overlap with each other, and
a third temperature range which is capable of being taken by the outside air does not overlap with the first temperature range and the second temperature range.

3. The data center according to claim 2, wherein the second temperature range is included in the first temperature range.

4. The data center according to claim 1, wherein when the second temperature is higher than a target temperature, the controller controls the cooling apparatus so as to increase the operation rate of the cooling apparatus, and when the second temperature is lower than the target temperature, the controller controls the cooling apparatus so as to decrease the operation rate of the cooling apparatus.

5. The data center according to claim 1, wherein the cooling apparatus further includes a water sprinkler that performs water sprinkling with respect to the pipe.

6. The data center according to claim 1, wherein the cooling apparatus further includes a blower that performs blowing with respect to the pipe.

7. The data center of claim 1, wherein a temperature of the cooling liquid is selectively controlled according to a change of a wet-bulb temperature of the outside air.

8. A control method of a data center including a liquid immersion tank, a cooling apparatus, and a pump apparatus, the control method comprising:
connecting the liquid immersion tank that holds an information processing apparatus in a cooling liquid directly to the cooling apparatus using a pipe while making a portion of the pipe that passes through the cooling apparatus to be continuous without being disconnected;

providing the pump apparatus in the pipe thereby delivering the cooling liquid from the cooling apparatus to the liquid immersion tank through the pipe;

exposing the portion of the pipe that passes through the cooling apparatus to outside air and a cooling water such that the cooling liquid flowing through the portion of the pipe is cooled directly by the outside air and by the cooling water in the cooling apparatus while continuously flowing through the portion of the pipe without being disconnected; and delivering the cooling liquid cooled directly by the outside air and the cooling water in the cooling apparatus to the liquid immersion tank via the pipe using the pump apparatus such that the cooling liquid is cooled directly by the outside air and by the cooling water while being circulated between the liquid immersion tank and the cooling apparatus through the pipe, a flow rate of the cooling liquid between the liquid immersion tank and the cooling apparatus is controlled based on a temperature difference between a first temperature of the cooling liquid flowing from the liquid immersion tank to the cooling apparatus and a second temperature of the cooling liquid flowing from the cooling apparatus to the liquid immersion tank, and an operation rate of the cooling apparatus is controlled based on the second temperature of the cooling liquid flowing from the cooling apparatus to the liquid immersion tank such that the second temperature of the cooling liquid from the cooling apparatus is maintained within a predetermined range of a target temperature;

the control method further comprising: measuring the first temperature by a first temperature sensor and measuring the second temperature by a second temperature sensor; and wherein the flow rate is controlled such that the temperature difference between the first temperature and the second temperature is equal to or lower than a predetermined temperature.

9. The control method according to claim 8, wherein a first temperature range which is capable of being taken by the information processing apparatus and a second temperature range which is capable of being taken by the cooling liquid partially overlap with each other, and a third temperature range which is capable of being taken by the outside air does not overlap with the first temperature range and the second temperature range.

10. The control method according to claim 9, wherein the second temperature range is included in the first temperature range.

11. The control method according to claim 8, wherein when the second temperature is higher than a target temperature, the cooling apparatus is controlled so as to increase the operation rate of the cooling apparatus, and when the second temperature is lower than the target temperature, the cooling apparatus is controlled so as to decrease the operation rate of the cooling apparatus.

12. The control method according to claim 8, further comprising:

performing water sprinkling with respect to the pipe.

13. The control method according to claim 8, further comprising:

performing blowing with respect to the pipe.

14. The control method of claim 8, wherein a temperature of the cooling liquid is selectively controlled according to a change of a wet-bulb temperature of the outside air.

* * * * *